(12) United States Patent
Yu et al.

(10) Patent No.: US 8,193,594 B2
(45) Date of Patent: *Jun. 5, 2012

(54) TWO-TERMINAL SWITCHING DEVICES AND THEIR METHODS OF FABRICATION

(75) Inventors: Gang Yu, Santa Barbara, CA (US); Chan-Long Shieh, Paradise Valley, AZ (US); Hsing-Chung Lee, Calabases, CA (US)

(73) Assignee: CBRITE Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/015,013

(22) Filed: Jan. 27, 2011

(65) Prior Publication Data

US 2011/0147761 A1    Jun. 23, 2011

Related U.S. Application Data

(63) Continuation of application No. 11/801,735, filed on May 9, 2007, now Pat. No. 7,898,042.

(60) Provisional application No. 60/857,750, filed on Nov. 7, 2006.

(51) Int. Cl.
*H01L 21/00* (2006.01)
*H01L 47/00* (2006.01)
*H01L 29/04* (2006.01)

(52) U.S. Cl. ............... 257/412; 257/5; 257/43; 257/76; 257/104; 257/E47.001; 257/49

(58) Field of Classification Search .............. 257/412
See application file for complete search history.

(56) References Cited

U.S. PATENT DOCUMENTS 4,042,293 A    8/1977    Hanak et al.
4,105,513 A    8/1978    Nishino et al.
(Continued)

FOREIGN PATENT DOCUMENTS

CN    1383168 A    12/2002
(Continued)

OTHER PUBLICATIONS

Birnstock et al., "Screen-printed Passive Matrix Displays Based on Light-emitting Polymers" Applied Physics Letters, American Institute of Physics. New York, US, vol. 78, No. 24, Jun. 11, 2001, pp. 3905-3907, XP001077323 ISSN: 003-6951 abstract.

(Continued)

*Primary Examiner* — Jarrett Stark
*Assistant Examiner* — Lawrence Tynes, Jr.
(74) *Attorney, Agent, or Firm* — Weaver Austin Villeneuve & Sampson LLP

(57) ABSTRACT

Two-terminal switching devices characterized by high on/off current ratios and by high breakdown voltage are provided. These devices can be employed as switches in the driving circuits of active matrix displays, e.g., in electrophoretic, rotating element and liquid crystal displays. The switching devices include two electrodes, and a layer of a broad band semiconducting material residing between the electrodes. According to one example, the cathode comprises a metal having a low work function, the anode comprises an organic material having a p+ or p++ type of conductivity, and the broad band semiconductor comprises a metal oxide. The work function difference between the cathode and the anode material is preferably at least about 0.6 eV. The on/off current ratios of at least 10,000 over a voltage range of about 15 V can be achieved. The devices can be formed, if desired, on flexible polymeric substrates having low melting points.

24 Claims, 16 Drawing Sheets

U.S. PATENT DOCUMENTS

| | | | |
|---|---|---|---|
| 4,223,308 | A | 9/1980 | Baraff et al. |
| 4,251,136 | A | 2/1981 | Miner et al. |
| 4,715,685 | A | 12/1987 | Yaniv et al. |
| 4,864,472 | A | 9/1989 | Yoshimura et al. |
| 4,952,984 | A | 8/1990 | Martens et al. |
| 5,117,298 | A | 5/1992 | Hirai |
| 5,122,889 | A | 6/1992 | Kaneko |
| 5,189,136 | A | 2/1993 | Wudl et al. |
| 5,357,357 | A | 10/1994 | Imazeki et al. |
| 5,455,736 | A | 10/1995 | Nishiyama et al. |
| 5,464,990 | A | 11/1995 | Shiratsuki et al. |
| 5,483,263 | A | 1/1996 | Bird et al. |
| 5,485,294 | A | 1/1996 | Sugiyama et al. |
| 5,926,236 | A | 7/1999 | Den Boer et al. |
| 6,008,872 | A | 12/1999 | Den Boer et al. |
| 6,017,259 | A | 1/2000 | Motoi et al. |
| 6,087,196 | A | 7/2000 | Sturm et al. |
| 6,177,921 | B1 | 1/2001 | Comiskey et al. |
| 6,372,154 | B1 | 4/2002 | Li |
| 6,380,922 | B1 | 4/2002 | Lynch et al. |
| 6,437,769 | B1 | 8/2002 | Kobayashi |
| 6,441,395 | B1 | 8/2002 | Yu et al. |
| 6,506,438 | B2 | 1/2003 | Duthaler et al. |
| 6,512,172 | B1 | 1/2003 | Salafsky et al. |
| 6,582,504 | B1 | 6/2003 | Fujita |
| 6,623,903 | B2 | 9/2003 | Lamotte |
| 6,707,060 | B2 | 3/2004 | Yu et al. |
| 6,734,460 | B2 | 5/2004 | Okumura et al. |
| 6,852,555 | B1 | 2/2005 | Roman et al. |
| 6,864,111 | B2 | 3/2005 | Yu et al. |
| 6,881,115 | B2 | 4/2005 | Yamamoto et al. |
| 6,891,237 | B1 | 5/2005 | Bao et al. |
| 6,958,251 | B2 | 10/2005 | Yamazaki |
| 7,030,412 | B1 | 4/2006 | Drzaic et al. |
| 7,161,797 | B2 | 1/2007 | Vaisman et al. |
| 7,405,775 | B2 | 7/2008 | Nilsson et al. |
| 7,491,575 | B2 | 2/2009 | Wu et al. |
| 7,528,896 | B2 | 5/2009 | Nilsson |
| 7,898,042 | B2 | 3/2011 | Yu et al. |
| 2002/0027636 | A1 | 3/2002 | Yamada |
| 2002/0053320 | A1 | 5/2002 | Duthaler et al. |
| 2002/0080637 | A1 | 6/2002 | Yi et al. |
| 2002/0106847 | A1 | 8/2002 | Kazlas et al. |
| 2002/0119584 | A1 | 8/2002 | Duthaler et al. |
| 2002/0127821 | A1 | 9/2002 | Ohya et al. |
| 2002/0179901 | A1 | 12/2002 | Arai et al. |
| 2004/0056180 | A1 | 3/2004 | Yu |
| 2004/0135518 | A1 | 7/2004 | Brune et al. |
| 2004/0179146 | A1 | 9/2004 | Nilsson |
| 2005/0105010 | A1 | 5/2005 | Oh |
| 2005/0154119 | A1 | 7/2005 | Robeson et al. |
| 2005/0224788 | A1 | 10/2005 | Hsu et al. |
| 2005/0227081 | A1 | 10/2005 | Hsu et al. |
| 2006/0027804 | A1 | 2/2006 | Yamazaki et al. |
| 2006/0061716 | A1 | 3/2006 | Yamaguchi |
| 2006/0076557 | A1 | 4/2006 | Waller et al. |
| 2006/0091397 | A1 | 5/2006 | Akimoto et al. |
| 2006/0092343 | A1 | 5/2006 | Nilsson |
| 2006/0145597 | A1 | 7/2006 | Brabec |
| 2008/0105870 | A1 | 5/2008 | Yu et al. |
| 2008/0138920 | A1 | 6/2008 | Nilsson et al. |
| 2008/0169464 | A1 | 7/2008 | Gong et al. |
| 2009/0085095 | A1 | 4/2009 | Kamath et al. |
| 2009/0224236 | A1 | 9/2009 | Nilsson |

FOREIGN PATENT DOCUMENTS

| | | |
|---|---|---|
| CN | 1739205 A | 2/2006 |
| EP | 1 251 720 | 10/2002 |
| JP | 61-089663 | 5/1986 |
| JP | 64-052128 | 2/1987 |
| JP | 62-138834 | 6/1987 |
| JP | 01-109328 | 4/1989 |
| JP | 01-125861 | 5/1989 |
| JP | 02-000831 | 1/1990 |
| JP | 04-093078 | 3/1992 |
| JP | 05-080356 | 4/1993 |
| JP | 2004 071682 | 3/2004 |
| JP | 03269995 A | 12/1991 |
| WO | 96/19837 | 6/1996 |
| WO | 99/39394 | 8/1999 |
| WO | WO 00 65653 | 11/2000 |
| WO | WO 2004/051750 | 6/2004 |
| WO | WO 2004/066410 | 8/2004 |
| WO | WO 2004/114008 | 12/2004 |
| WO | WO 2005/090434 | 9/2005 |
| WO | WO 2008/057553 | 5/2008 |
| WO | WO 2008/057560 | 5/2008 |

OTHER PUBLICATIONS

Patent Abstracts of Japan vol. 016, No. 084 (E-1172), Feb. 28, 1992 & JP 03269995 A (Ricoh Co Ltd.), Dec. 2, 1991 abstract.
U.S. Office Action dated Sep. 21, 2005 in related U.S. Appl. No. 10/759,807.
U.S. Office Action dated Sep. 20, 2006 in related U.S. Appl. No. 10/759,807.
U.S. Office Action dated Apr. 5, 2007 in related U.S. Appl. No. 11/298,098.
U.S. Office Action dated Apr. 19, 2007 in related U.S. Appl. No. 10/759,807.
H.-C. Lee et al., U.S. Appl. No. 11/430,075, filed May 8, 2006.
C.-L. Shich et al., U.S. Appl. No. 11/650,148, filed Jan. 5, 2007.
First Office Action for Application No. EP04703079.6, dated Feb. 2, 2010.
Fourth Office Action for Application No. CN200480002330.9, dated Jan. 8, 2010.
U.S. Office Action for U.S. Appl. No. 12/009,386 mailed Jul. 8, 2008.
Notice of Allowance for U.S. Appl. No. 12/009,386 mailed Feb. 10, 2009.
Office Action for Chinese Patent Application 2004-80002330.9 mailed Dec. 26, 2008.
International Search Report and Written Opinion mailed May 29, 2008 for PCT/US2007/023427.
International Search Report and Written Opinion mailed May 29, 2008 for PCT/US2007/02344.
Notice of Allowance mailed Nov. 30, 2007 for U.S. Appl. No. 10/759,807, filed Jan. 16, 2004.
Kamijama, S.: Saeki; T.; Mori, H.; Numasawa, Y. Electron Devices Meeting, 1991, Technical Digest., International Volume Issue, Dec. 8-11, 1991 pp. 827-830.
Final Office Action mailed May 1, 2008 for U.S. Appl. No. 11/298,098.
Office Action for Chinese Patent Application 2004-80002330.9 mailed Jul. 17, 2009.
U.S. Office Action for U.S. Appl. No. 11/983,205 mailed May 24, 2010.
First Office Action for Application No. 2006-501075, dated Mar. 12, 2010.
U.S. Office Action for U.S. Appl. No. 11/801,735, mailed Sep. 4, 2009.
U.S. Final Office Action for U.S. Appl. No. 11/983,205, mailed Dec. 5, 2010.
U.S. Final Office Action for U.S. Appl. No. 11/801,735, mailed Mar. 30, 2010.
U.S. Notice of Allowance for U.S. Appl. No. 11/801,735, mailed May 25, 2010.
U.S Notice of Allowance for U.S. Appl. No. 11/801,735, mailed Nov. 3, 2010.
Baytron® for Solid Electrolyte Capacitors, downloaded on Nov. 7, 2007, from http://www.baytron.com/index.php?page_id=971.
First Office Action for Application No. 200780049295.X dated Dec. 14, 2010.
First Office Action for Application No. 200780049394.8 dated Aug. 4, 2010.
2nd Office Action for Application No. 2006-501075, dated Dec. 14, 2010.
U.S. Office Action dated Feb. 14, 2011 issued in U.S. Appl. No. 11/983,205.
U.S. Office Action dated Jul. 22, 2011 issued in U.S. Appl. No. 11/983,205.

U.S. Office Action dated Jun. 28, 2011 issued in in U.S. Appl. No. 12/411,210.

PCT International Search Report dated Jul. 20, 2004 issued in PCT/US2004/001557.

PCT International Preliminary Report on Patentability and Written Opinion dated Jul. 22, 2005 issued in PCT/US2004/001557.

CN First Office Action dated Jul. 11, 2008 issued in CN 200480002330.9.

EP Examination Report dated Mar. 9, 2011 issued in EP 04 703 079.6.

PCT International Preliminary Report on Patentability and Written Opinion dated May 12, 2009 issued in PCT/US2007/023427.

Patent Abstracts of Japan vol. 0153, No. 34 (E-11 04), Aug. 26, 1991 & JP 03, 126275, A, (Seiko Epson Corp), May 29, 1991.

Patent Abstracts of Japan vol. 0133, No. 71 (E-807),Aug. 17, 1989 & JP 01, 125861, A, (Japan Synthetic Rubber Co Ltd), May 18, 1989.

TWO-TERMINAL SWITCHING DEVICES AND THEIR METHODS OF FABRICATION

CROSS-REFERENCE TO RELATED APPLICATIONS

This application is a Continuation of U.S. patent application Ser. No. 11/801,735, filed May 9, 2007, naming Yu et al. as inventors, which claims benefit of prior U.S. Provisional Application No. 60/857,750 filed Nov. 7, 2006, titled "Metal-insulator-metal (MIM) devices and their methods of fabrication" naming Gong et al. as inventors, which are herein incorporated by reference for all purposes. This application is related to the following US patent applications, each of which is incorporated herein by reference in its entirety and for all purposes: (1) U.S. Provisional Application No. 60/440,709 filed Jan. 17, 2003; (2) U.S. patent application Ser. No. 10/759,807 filed Jan. 16, 2004, published Sep. 16, 2004 with a U.S. Patent Application Publication No. 2004/0179146 titled "Display Employing Organic Material" naming Boo Jorgen Lars Nilsson as an inventor, which claims benefit of prior U.S. Provisional Application No. 60/440,709 filed Jan. 17, 2003, and to (3) U.S. patent application Ser. No. 11/298,098 filed Dec. 8, 2005, published May 4, 2006 with a U.S. Patent Application Publication No. 2006/0092343, which is a divisional of U.S. patent application Ser. No. 10/759,807.

FIELD OF THE INVENTION

The invention relates to two-terminal switching devices, such as thin film diodes, and methods of their fabrication.

BACKGROUND OF THE INVENTION

Active matrix displays employ a switch at each picture element in a matrix display so that the voltage across each pixel can be controlled independently. Active matrices are especially suitable for high information content Liquid Crystal Displays (LCDs) such as LCDs used in multi-media players, cell phones, monitors and television screens.

Other types of displays that typically require a switching device at each picture element include Electrophoretic Displays (EPDs) and Rotating Element Displays. Electrophoretic displays, including displays available from companies such as E-Ink and Sipix, produce an image relying on translational movement of charged colored particles suspended in a liquid of a different color. Rotating element displays use rotational movement of optically and electrically anisotropic elements, such as bichromal spheres having a non-uniform charge distribution. Pixel performance of electrophoretic and rotating element displays can be controlled with a switching device that provides on- and off- voltages to each of the picture elements in the display matrix.

Switching devices that have been proposed for active matrix display applications include various types of Thin Film Transistors (TFTs) and Thin Film Diodes (TFDs).

SUMMARY

Two-terminal switching devices, such as thin film diodes, compare favorably to TFTs, in many aspects. First, fabrication of TFDs consumes fewer resources than TFT fabrication. The channel between the source and the drain in a TFT requires rigorous alignment with the gate electrode underneath or above in order to achieve the necessary performance. Hence, expensive precise patterning is essential in TFT fabrication. In contrast, TFD architecture does not impose such strict requirements on the patterning process. Since the diode current is determined by the overlaid area of the two contact electrodes, and this area is insensitive to shifts in the position of contact stripes, the TFD fabrication process typically requires less precision patterning.

Further, materials used in TFTs must meet more stringent electronic properties (such as mobility), than materials used in diodes. Commonly, highly ordered materials, exhibiting high carrier mobility are needed for TFTs. Deposition of such highly ordered materials can be accomplished, in some cases, only with the use of high-temperature processing. In many cases, this requirement does not allow polymeric substrates with low melting point to be used for TFT-containing backplanes of displays.

In contrast, materials having lower carrier mobility can be used in diodes, and, therefore, high-temperature processing is not always required in diode fabrication. In certain embodiments, the diode-containing backplanes provided herein can be formed on substrates that have a glass transition temperature, or a melting point, or a decomposition point as low as 150° C., and even 100° C. Thus, with diodes, backplanes formed on flexible and even foldable low-melting polymeric substrates can be fabricated. These backplanes can be further used in fabrication of flexible and foldable displays. Further, in some embodiments, arrays of TFDs are fabricated without making use of expensive photolithography tools, e.g., without making use of high precision lithography that defines the device features (referring to pattern size and space between features) at 5 micron or at a finer precision.

Generally, the two-terminal switching devices provided herein are characterized by high on/off current ratios and by high breakdown voltage. Several embodiments of such devices and their methods of fabrication will be described. In some embodiments an on/off current ratio of at least about 1,000, at least about 5,000, and in many cases at least about 10,000 is obtained. Significantly, in some embodiments, these devices can function over a large range of driving voltage, e.g. over at least about 15 V. For example, switching devices having an on/off current ratio of at least about 10,000 for a driving voltage range of at least about 15 V are herein provided.

The two-terminal switching devices provided herein can be used in a number of applications that require switches with high ratios of on/off current. They are particularly well suited for applications that use relatively large driving voltages, e.g., applications where the difference between the on and off voltage is at least about 15 V. In other embodiments, however, the provided diodes will also find applications employing smaller voltage ranges. Two-terminal switching devices provided herein can be used as switches in the driving circuits of a variety of display types. These include active matrix electrophoretic displays, rotating element displays, liquid crystal displays, etc. The applications of provided two-terminal switching devices are, however, not limited to active matrix displays applications. Other potential uses can include, for example, switches for Microelectromechanical System (MEMS) devices, field emission devices, electrochromic devices, electroluminescent devices, photodetectors, biosensors, and the like.

One aspect of the invention pertains to two-terminal switching devices. In certain embodiments, such devices include, in the following order, a first electrode provided on a substrate, a layer of a broad band semiconducting material, and a second electrode. The first electrode (a cathode) comprises a layer of a first conductive material, having a first work function magnitude. The second electrode (an anode) comprises a layer of a second conductive material, having a second work function magnitude. The electrode materials are selected such that the second work function magnitude is higher than the first work function magnitude. In some embodiments, the second work function is at least about 0.6 eV, e.g., at least about 0.8 eV greater than the first work function. In certain embodiments, the second conductive material comprises a material having a p+ or p++ type conductivity. The on/off current ratio of such devices is related to the work function difference between the anode and a cathode, with larger work function differences leading to larger on/off current ratios, as desired.

The device structure is formed such that at least a portion of the semiconductor layer resides between the first and second conductive materials, while the first and second conductive materials do not contact each other. In some embodiments, additional layers may be interposed between the first electrode and the semiconductor layer and/or between the semiconductor layer and the second electrode. Additionally or alternatively, the device includes a layer contacting the first electrode opposite the semiconductor layer and/or a layer contacting the second electrode opposite the semiconductor layer. For example, a layer of metal can be optionally positioned opposite the semiconductor layer, next to the anode material to improve the contact to an anode.

In some embodiments, the broad band semiconductor material contains an inorganic material, which can be an n-type semiconductor. The carrier concentration in the n-type semiconductor is preferably less than about $10^{18}$ cm$^{-3}$, e.g., less than about $10^{17}$ cm$^{-3}$. It has been demonstrated that devices having an n-type broad-band semiconductor and a p+ or p++ type anode material (such as p-doped organic polymer or a p-type inorganic oxide or sulfide) exhibited highly desirable electrical performance, such as high on/off current ratios and high breakdown voltage. In some embodiments, the semiconductor material contains a significant amount of ionic bonding, e.g., as in certain metal oxides and chalcogenides. In some embodiments the semiconductor layer can further contain organic material, e.g., it can contain a hybrid organic-inorganic material, an organometallic compound, or a complex of metal with an organic ligand.

In some embodiments, it is preferred that the semiconductor layer is entirely inorganic and does not contain organic materials. Inorganic semiconductor materials are typically less prone to degradation during normal use compared to organic semiconductor materials. Therefore, switches with increased lifetime can be obtained when inorganic semiconductor layer is employed. However, it is understood, that such degradation may not be inherent in all of the embodiments employing organic-containing semiconductors, and such materials can still be used in the switching devices provided herein, e.g., in auxiliary sub-layers described above.

The device materials are preferably selected to meet multiple electronic requirements, which may be applied either independently or in concert. In some embodiments, in order to achieve facile injection of electrons from the cathode into the semiconductor layer, the first conductive material and the broad band semiconductor, are selected such that the Fermi energy level of the first conductive material is within about 0.3 eV (preferably within about 0.2 eV) of the lowest-lying energy level of the semiconductor conduction band. The first conductive material in some embodiments comprises a material with a low work function, e.g., a material having a work function of less than about 4.5 eV. Suitable materials include but are not limited to metals selected from the following group: Mg, Ca, Sr, Ba, Ti, V, Cr, Mn, Ta, Al, Ga, In, Nb, Hf, Zn, Zr, Mo, Ni, Cu, Sn and Y. Further, rare earth metals, such as lanthanides (e.g., Sm and Nd) can be used. The first conductive material can comprise these metals in pure form or as alloys with each other or with different alloying materials.

The second conductive material is typically selected to have a relatively high work function or Fermi energy, e.g., at least about 4.8 eV, more preferably at least about 5 eV, and to be doped to a level producing a p+ or p++ type conductive material. The carrier concentration in the second conductive material should preferably be at least about $10^{18}$ cm$^{-3}$, more preferably at least about $10^{19}$ cm$^{-3}$. In some embodiments the materials are selected such that the energy barrier between the lowest energy level of the conduction band of the broad-band semiconductor material and the lowest energy level of the conduction band of the p+ or p++ type conductor material of the anode is less than about 0.3 eV. Such energy alignment maximizes the forward current in the device. However, if carrier concentration in the p++ material is sufficiently high (e.g., at least about $10^{19}$ cm$^{-3}$), good device performance can be obtained even with significantly higher energy gaps than 0.3 eV.

The second conductive material can be organic or inorganic. In some embodiments, organic-containing anodes are particularly preferred, since they may be easily deposited by liquid-phase deposition techniques, at low temperature and in air, and, in some embodiments, they can be deposited in a pattern, e.g., by printing. Suitable organic materials include organic polymers and oligomers, e.g., polymers such as polythiophenes, polythienothiophenes, polypyrroles, polyanilines, derivatives and copolymers thereof, wherein each of the conductive polymers can be substituted or unsubstituted. A variety of organic and inorganic dopants leading to p-type conductivity can be used. In some embodiments, the second conductive material comprises poly(3,4-ethylenedioxythiophene) (PEDOT) and the dopant is poly(4-styrene sulphonate) (PSS) or dimethylsulfoxide (DMSO). In some embodiments, the second conductive material is selected from the group consisting of doped PEDOT, polyaniline (PANI), polypyrrole (PPY) and polythienothiophene (PTT), wherein each of these polymers can be substituted or unsubstituted. Suitable dopants that can be used with organic conductive materials include sulfonic acids, such as PSS, dodecylbenxene sulfonic acid (DBSA), fluorinated sulfonic acids (e.g., NAFION® polymers), and phosphonates.

In some embodiments, the second conductive material includes an inorganic conductor having a p-type conductivity. Such inorganic p-type conductors are known in the art and include certain non-stoichiometric oxides, such as molybdenum oxide ($Mo_2O_{3-\delta}$) and nickel oxide, as well as certain inorganic oxides and sulfides with mixed-valence dopants, such as doped copper sulfides, e.g., zinc-doped copper aluminum sulfide and O or Cl doped ZnSe.

The broad band semiconductor layer preferably contains a semiconductor material having a band gap of at least about 2.5 eV, more preferably at least about 3 eV. Some materials that are sometimes viewed as insulators, such as titanium oxide, tantalum oxide, may be employed as broad band semiconductors, and are within the scope of the described embodiments. In some embodiments, an n-type semiconductor is used. As mentioned, the semiconductor may have a substantial ionic bonding component (as opposed to covalent or molecular bonding). In certain embodiments, the semiconductor material has a carrier concentration of less than about $10^{18}$ cm$^{-3}$, e.g., less than about $10^{17}$ cm$^{-3}$. Examples of suitable semiconductors include metal oxides, metal sulfides, other metal chalcogenides (e.g., metal selenides and metal tellurides), and inorganic ceramic nanocomposites. Examples of suitable materials for use in the semiconductor layer include $Mg_xO_y$, $Ca_xO_y$, $Sr_xO_y$, $Ba_xO_y$, $Ti_xO_y$, $Ta_xO_y$, $Al_xO_y$, $In_xO_y$, $Nb_xO_y$, $Hf_xO_y$, $Sn_xO_y$, $Zn_xO_y$, $Zr_xO_y$, $Cu_xO_y$, $Y_xO_y$, $Y_xBa_yO_z$ and $Sm_xSn_yO_z$. In some embodiments, the inorganic semiconductor layer, e.g., a layer containing a metal oxide is formed by transforming a portion of a previously deposited conductive material, e.g., by anodizing the metal. This approach is particularly convenient when the first electrode material is deposited and an upper portion is then converted by chemical or physical transformation to directly create the semiconductor layer. In other embodiments, the semiconductor layer is independently deposited by, e.g., using a sputtering technique, thermal deposition, or chemical bath deposition (CBD). These embodiments may be particularly preferred, for fabricating devices in which the inorganic semiconductor layer contains a metal oxide or chalcogenide of a different metal, than the one used in the cathode.

In some embodiments, a two-terminal switching device, such as one having the structure described above, is provided on a substrate having a melting point, a glass transition temperature or a decomposition temperature of less than about 150° C. In certain embodiments, the two-terminal switching device has an on/off current ratio $I_{on}(V_{on})/I_{off}(V_{off})$ at least about 1,000, e.g., at least about 10,000 when the magnitude of separation between $V_{on}$ and $V_{off}$ is at least about 15 V. For example, the device may have an $I_{on}(V_{on})/I_{off}(V_{off})$ ratio at least about 10,000, wherein the forward bias ($V_{on}$) is about 2 V, and the reverse bias ($V_{off}$) is about −15 V.

The breakdown voltage value of provided switching devices, according to some embodiments is at least about 1.5 times greater than the $V_{off}$ voltage. For $V_{off}$=15 V, the breakdown voltage may be at least about 20 V, e.g., at least about 22.5 V in magnitude.

The provided two-terminal switching devices can be used to regulate light from a pixel of a display, e.g., in an electrophoretic or in a rotating element display. In some embodiments, the switching devices can also be used in liquid crystal displays. The display typically comprises a plurality of pixel control circuits (e.g., an array of pixel control circuits in a back plane), and, according to some embodiments, each pixel control circuit of the plurality comprises at least one two-terminal switching device.

According to another aspect, a method of forming a two-terminal switching device is provided. In certain embodiments, the method includes forming a first electrode of the two-terminal switching device on a substrate, where the first electrode comprises a layer of a first conductive material; forming a layer of a broad band semiconductor over at least a portion of the first electrode; and forming a second electrode by forming a layer of a second conductive material. The second material has a higher work function than the first material, and has a p+ or a p++ type conductivity. The semiconductor layer may be an inorganic material—particularly one having significant ionic bonding. According to some embodiments, fabrication of the device does not involve heating the substrate to a temperature greater than about 100° C., and, in some embodiments greater than about 150° C., or greater than about 200° C.

In some embodiments, forming at least one of the first and second electrodes comprises depositing a liquid-phase material. For example, the second conductive material, e.g., an organic polymer, can be deposited using printing, dispensing, dip-coating or a spin on technique followed by patterning, or by forming a pattern while depositing.

Forming the broad band semiconductor can be performed by modifying at least a portion of an underlying layer (e.g., a layer of the first conductive electrode material) by a method such as anodization, chemical treatment, plasma treatment and thermal treatment. In other embodiments, the broad band semiconductor can be directly deposited using a technique such as sputtering. The broad band semiconductor can also be formed using chemical bath deposition. Preferably, the broad band semiconductor comprises an inorganic material.

According to one example, the switch fabrication involves depositing a layer of metal, forming a layer of metal oxide, and then depositing a layer of conductive organic polymer or oligomer on the layer of metal oxide.

In another aspect of the invention, a method of forming a two-terminal switching device having reduced leakage current is provided. The leakage current can be reduced by treating the inorganic semiconductor to remove at least some of the surface traps at the device interfaces. According to one embodiment, the method involves forming a first electrode; subsequently forming a layer of a broad band inorganic semiconductor over at least a portion of the first electrode; treating an exposed surface of the inorganic semiconductor layer to remove at least some surface traps; and forming a second electrode by depositing a layer of a second conductive material on the exposed surface of the inorganic semiconductor layer. Treatment of the inorganic semiconductor can be carried out as a separate operation performed prior to formation of the second electrode, or it can be performed concurrently with the electrode formation. For example, in some embodiments, the inorganic semiconductor is treated with an acidic composition concurrently with formation of the second conductive layer. In some embodiments, an acidic composition comprising an organic p-type conductor, is applied to the surface of semiconductor layer comprising metal oxide. A small controlled amount of etching occurs at the metal oxide surface, thereby removing surface traps contributing to leakage currents.

In another aspect, a method of forming a backplane for a display is provided.

The method includes forming a plurality of pixel control circuits on a substrate, such as a flexible substrate. The circuits are formed such that each pixel control circuit comprises at least one two-terminal switching device being configured to regulate light from a pixel. The method may form the plurality of circuits in an array as for a display back plane. The provided two-terminal switching devices can be formed according to a method as described above.

These and other features and advantages of the present invention will be described in more detail below with reference to the associated drawings.

BRIEF DESCRIPTION OF THE DRAWINGS

The present invention is illustrated by way of example, and not by way of limitation.

DETAILED DESCRIPTION OF A PREFERRED EMBODIMENT

Introduction and Terminology

Figure 1A:
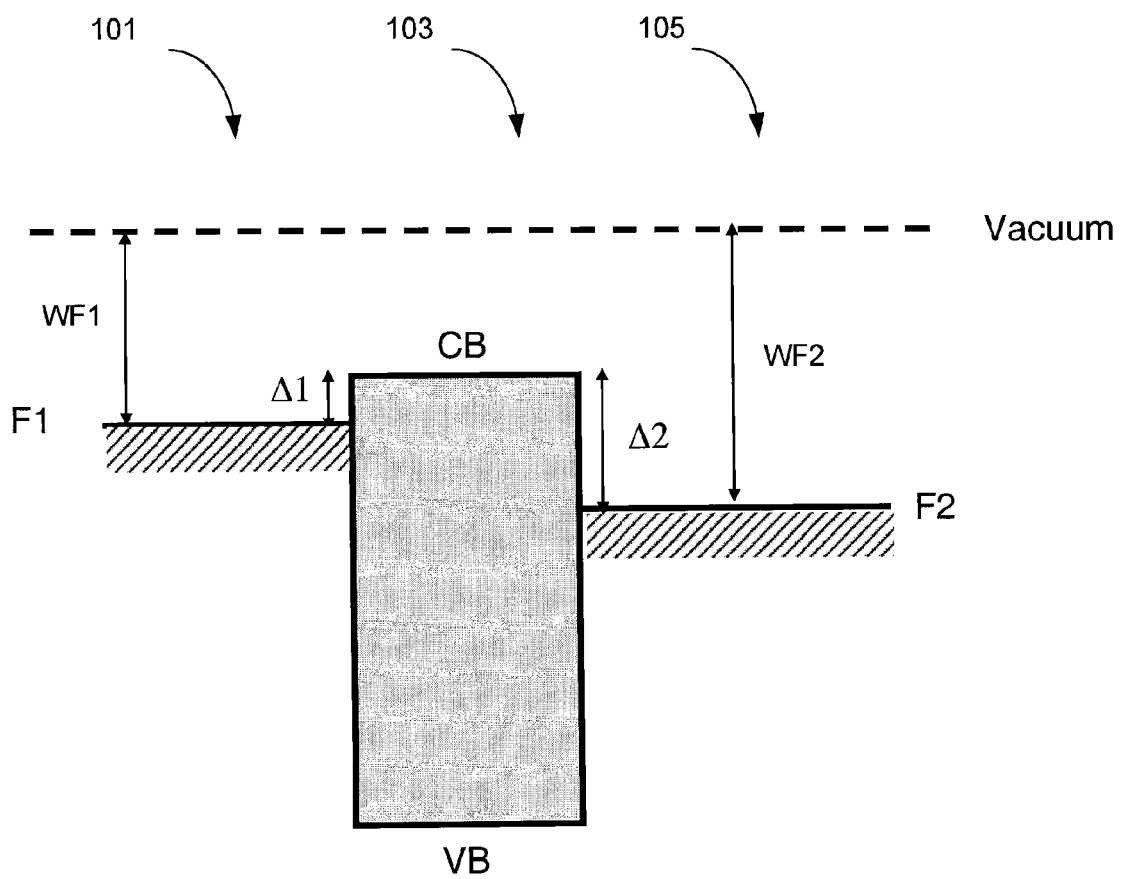
FIGS. 1A-1C present energy diagrams for two-terminal switching devices in accordance with several embodiments of present invention.

Several embodiments of two-terminal devices having high ratios of on/off current and high breakdown voltage are provided. Further, in some embodiments, the provided devices are formed without making use of high-temperature processing on polymeric substrates having a low melting point, glass transition point or decomposition temperature (e.g., less than 150° C.). Provided devices can be used in, for example, the driving circuits of electrophoretic displays, rotating element displays and liquid crystal displays. Examples of suitable driving circuits are described in, e.g., the commonly owned U.S. patent application Ser. No. 10/759,807 previously incorporated by reference.

The devices described herein operate as switches by allowing current pass in one direction when a first, forward bias, voltage is applied to the device electrode, while allowing very little current pass in the reverse direction when a second, reverse bias, voltage is applied to the electrodes. For example, when forward bias is applied to the electrodes of the switching device, the current flows between the electrodes, and the switch is in the "on" position. When no bias or a reverse bias is applied, the reverse current is minimal, and the switch is in the "off" position. Thus, the device switching ratio is defined as $I_1(V_1)/I_2(V_2)$, wherein $I_1$ and $I_2$ are current values measured respectively at an "on" bias $V_1$ and at an "off" bias $V_2$. Significantly, various devices of this invention can operate over large bias ranges. For example, the magnitude of $V_{on}-V_{off}$ can be at least about 10V, e.g., at least about 15V for a single device. Even higher voltage applications such as plasma displays (approximately 80 volts) and MEM devices (approximately 100 volts) may be suitable for use with switching devices of this invention. In one particular illustration, the $V_{on}$ bias is about 2 V, while the $V_{off}$ bias is about −15 V. Thus, the magnitude of $V_{on}-V_{off}$ is about 17 V. The switching ratio in this case is measured as the ratio of currents at 2V and at −15V. Provided devices may achieve switching ratios of at least about 1000, preferably at least about 10,000, even more preferably at least about 10$^5$, for the bias ranges described above. Such characteristic makes them particularly suitable for those applications where relatively large driving voltages are needed, e.g., in the backplanes of electrophoretic and rotating element displays, in the driving circuits of MEMS devices, field emission devices, electrochromic devices, electroluminescent devices, photodetectors, biosensors, etc. It is understood, that the provided devices, in some embodiments, may also serve in applications employing smaller ranges of $V_{on}$ and $V_{off}$ biases, e.g., the magnitude of $V_{on}-V_{off}$ may be less than 10 V, for example about 5 V in some cases such as in driving twisted-nematic liquid crystal displays.

Another advantageous characteristic of provided devices is their high breakdown voltage. In some embodiments, the breakdown voltage magnitude is at least about 20 V, preferably 1.5 times larger than the magnitude of $V_{off}$. The breakdown voltage can be defined as a voltage at which the device is permanently damaged resulting in irreproducible reverse currents.

Figure 1B:
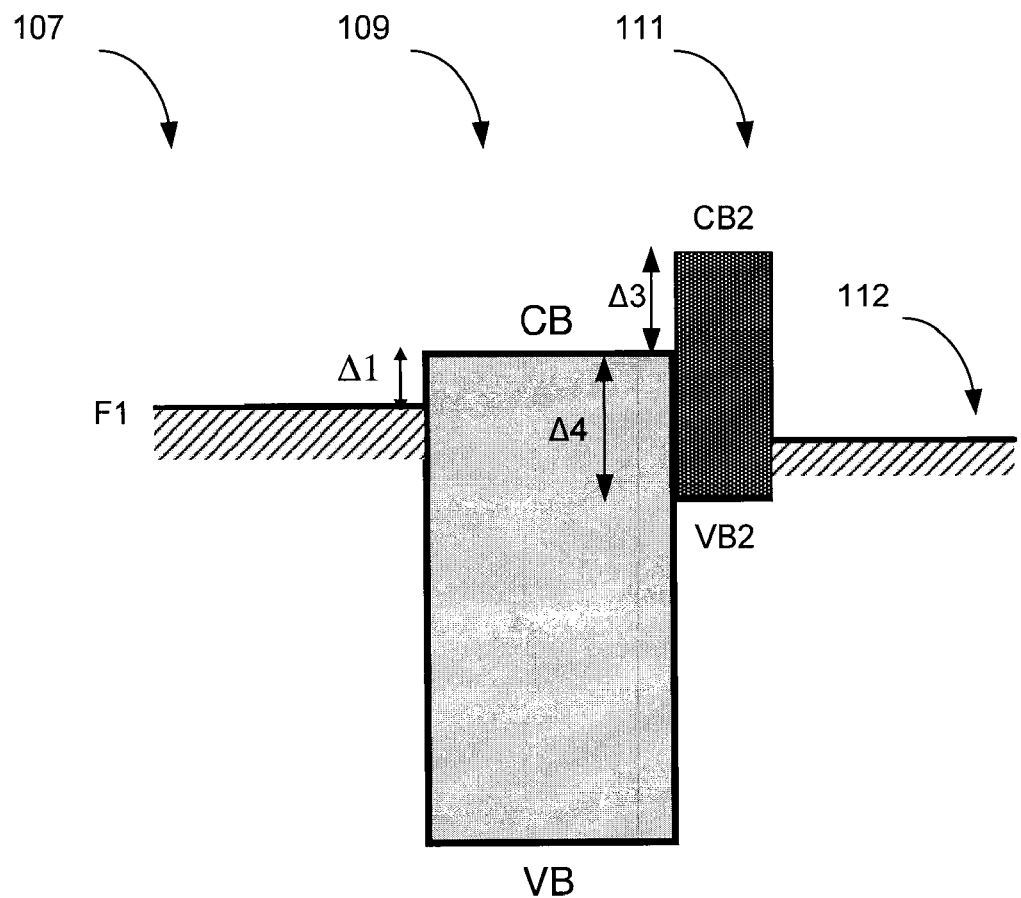
Figure 1C:
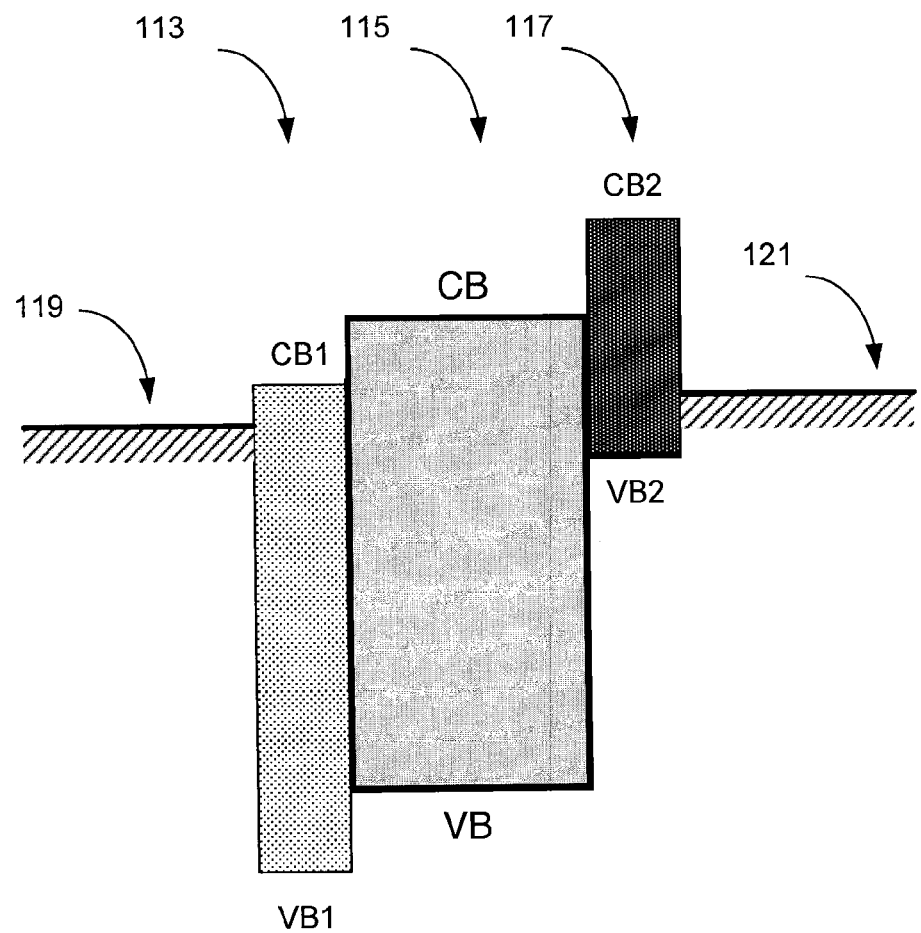

For context, electronic characteristics of two-terminal switching devices such as some of those provided herein will be illustrated with reference to energy diagrams presented in FIGS. 1A-1C. FIG. 1A presents a simplified energy diagram illustrating electronic aspects of certain devices. The typical switching device includes two electrodes and a layer of broad-band semiconducting material residing between the electrodes. Note that the electrodes typically comprise conductive materials, or semiconducting materials with high carrier concentrations (typically at least about 10$^{18}$ cm$^{-3}$), which are also often referred to as conductors (e.g., doped organic conducting polymers). The broad band semiconducting material can comprise materials that may also, in certain contexts, be referred to as insulating materials. For example, the middle layer in Metal-Insulator-Metal (MIM) diodes is within the scope of provided embodiments, when MIM diodes are broadly defined as devices having two layers of conducting material and a layer of an insulating or semiconducting material residing between the conductors. Examples of such MIM diodes, are described in U.S. Provisional Application No. 60/857,750, previously incorporated by reference.

In an embodiment, presented in FIG. 1A, the first electrode comprises a layer of first conductive material 101, characterized by a Fermi energy level F1, and a work function WF1. The first conductive material 101 contacts a layer of broad band semiconductor 103, characterized by the highest valence band energy VB (also referred to as HOMO (highest occupied molecular orbital)) and the lowest conduction band energy CB (also referred to as LUMO (lowest unoccupied molecular orbital)). In certain embodiments, the band gap, defined as the magnitude of VB-CB, is between about 2.5 eV and 4 eV, e.g., between about 3 eV and 3.5 eV. Large band gap semiconductors often provide devices that are relatively stable to thermal exposure and to ambient light. Note, that certain materials, that are often viewed as insulators, such as many metal oxides, are fully within the scope of provided broad band semiconductor materials. A second electrode, comprising a second conductive material 105, having a Fermi energy level F2 and a second work function WF2 contacts the layer of broad band semiconductor material, without contacting the first electrode. The conductive materials are selected such that the second work function is greater than the first work function. The electrode with a smaller magnitude work function is often referred to as a cathode, while the electrode with a higher magnitude work function is referred to as an anode.

The on/off switching ratio of a device is impacted by, among other parameters, the energy barrier Δ1 between the LUMO of the semiconductor layer 103 and the Fermi energy level of the first conductive material 101, and by the energy barrier Δ2, between the LUMO of the semiconductor layer 103 and the Fermi energy level of the second conductive material 105. With a small energy barrier Δ1, the current carriers (holes or electrons) are easily injected into the semiconductor layer, resulting in a higher forward current. In some embodiments, the first conductive material and the broad band semiconductor are selected such that F1 is very closely aligned with CB, e.g., the magnitude of Δ1 does not exceed about 0.4 eV, and more preferably does not exceed about 0.3 eV.

Similarly, with a large energy barrier Δ2, it is more difficult to achieve current carrier injection from the second electrode into the semiconductor layer, resulting in smaller reverse current. Therefore, in order to achieve high $I_{on}/I_{off}$ ratios, device materials should preferably be selected such that Δ1 is minimized, while Δ2 is maximized. Since these values are tied to work functions of the electrode materials, the difference between the electrode work functions should to some degree be maximized. In some embodiments, the magnitude of WF2−WF1 should be at least about 0.6 eV, preferably larger than 0.8 eV. In some embodiments, the cathode comprises a material having a work function with a magnitude of less than about 4.5 eV, preferably less than about 4.2 eV. In some embodiments, the anode comprises a material having a work function with a magnitude of at least about 4.8, preferably at least about 5 eV, e.g. at least about 5.2 eV.

It is understood, that while the numerical values listed above provide the guidelines for electronic properties of the device with improved performance, they need not necessarily be applied to one device in concert. For example, in some embodiments the work function difference between the electrodes can be smaller than 0.8 eV, e.g., a cathode material having a 4.5 eV work function, and an anode material having a 5.2 eV work function might be used. Another example is a cathode having a work function of 4 eV and an anode having a work function of 4.6 eV. The provided various electronic characteristics complement each other, and can be used in device design, either independently or in concert.

While selection of materials with electronic properties as described above is an important factor for building a device having a desired switching performance, other more subtle factors also need to be considered. These factors include Fermi level pinning, carrier mobility and carrier concentration, the carrier properties being especially important in the semiconductor material.

Fermi level pinning occurs at certain interfaces between conducting and semiconducting materials, and can be especially pronounced at interfaces between two inorganic materials. It is often the result of surface traps at such interfaces. Fermi level pinning manifests itself in Fermi level shift, typically resulting in lowering of an energy barrier at an interface. For example, referring to FIG. 1, Fermi level pinning can effectively raise the F2 energy level at the interface, thereby undesirably lowering Δ2 value, and, consequently, leading to potentially higher reverse currents. Fermi level pinning can be reduced, in many embodiments, by using an organic/inorganic interface. In some embodiments, the broad band semiconductor layer comprises an organic material, while the anode is predominantly inorganic. However, while such configuration will decrease the pinning effect, the use of an organic material in the semiconductor layer can be undesired in some applications because the organic material easily degrades during the use of the device. To the contrary, when an organic material is used as part of an anode, the device is much less prone to degradation. Therefore, according to one embodiment presented herein, the broad band semiconductor layer comprises an inorganic material, while the anode comprises an organic material, such as a conductive polymer.

As demonstrated in the examples presented below, certain p-type organic conductors have a pH<7 in their solution phase; i.e., they are acidic. For example, materials containing partially protonated acidic groups, such as sulphonates, phosphates, and carboxylates, are used as p-type conductors. Processing such materials on the top of inorganic metal oxide based semiconductor layer not only forms an effective anode layer, but also provides a self-surface cleaning which reduces or eliminates surface defects observed in devices fabricated without such treatment. In some embodiments, the semiconductor layer may undergo a separate treatment, prior to formation of the anode layer, in order to reduce or eliminate surface defects. Examples of such treatments include $O_2$, plasma pre-treatment, acidic pre-treatment, treatment with a reactive species, e.g., heating the partially fabricated device with $H_2S$.

In some embodiments, n-type broad band semiconductors having carrier concentrations of less than about $10^{17}$ cm$^{-3}$, e.g., less than about $10^{16}$ cm$^{-3}$, are preferred. Further, in some embodiments, to prevent leakage currents at the defect sites, mobility of carriers in the semiconductor layer is selected to be less than about 1 cm$^2$/Vsec, preferably less than about 0.1 cm$^2$/Vsec. Further, in some embodiments, it is preferred to use inorganic semiconductor materials having significant amounts of ionic bonding, rather than covalent or molecular bonding. Thus, in some embodiments, compounds of metals (e.g., group II and III metals, transition metals, or rare earth metals) with group VI elements, such as metal oxides and chalcogenides can be used.

In some embodiments, reduction in reverse current as well as reduction in surface trapping and Fermi level pinning can be achieved by employing an interface between an n-type broad band semiconductor and a p+ or p++ type anode material. When the major carriers in the device are electrons, and, particularly, when the broad band semiconductor layer comprises an n-type material, the use of p+ or p++ type anode can significantly reduce the number of available electrons, and thereby reduce the reverse current. Further, such an interface will provide fewer surface traps for the electrons. The p+ or p++ materials described herein may typically have a hole concentration of greater than about $10^{18}$ cm$^{-3}$, and, in certain cases, greater than about $10^{19}$ cm$^{-3}$. An energy diagram for such device is illustrated in the FIG. 1B. The Fermi energy level F1 of the cathode 107, and the broad-band semiconductor 109 energy levels VB and CB are not changed, while the anode 111 now has an energy band gap, characterized by highest valence band VB2 and a lowest conductance band CB2. While the band gap CB2-VB2 can vary widely, with both wide and narrow band materials being suitable, in some embodiments it is preferred that CB2 is higher in energy than CB. Further, in order to achieve facile electron flow from the semiconductor layer to the anode, it is preferable to have a relatively small energy barrier Δ3 between the lowest energy level of conduction band of the semiconductor layer CB and the lowest energy level of the conduction band of the anode material CB2. In some embodiments, semiconductor and anode materials are selected such that Δ3 is less than about 0.3 eV. Large concentration of holes in the anode material is also desirable for obtaining high forward current. In some embodiments, hole concentration of at least about $10^{19}$ cm$^{-3}$ is preferred. The electronic requirements described with respect to the energy diagram presented in FIG. 1A, also apply to the device having an anode with p+ or p++ conductivity shown in FIG. 1B. For example, in the energy diagram shown in FIG. 1B, the difference between Δ4 (barrier between VB2 and CB) and Δ1 approximately corresponds to the difference between work functions of anode and cathode, and, is preferably selected to be at least about 0.6 eV, e.g., at least about 0.8 eV. Both organic and inorganic materials having p+ or p++ type conductivity can be used in an anode. In some embodiments, it is preferred to use organic-containing anode materials, due to their facile processing and deposition methods. Organic materials with p+ and p++ doping levels include doped organic conjugated polymers and oligomers, such as PEDOT, PANI, PPY, PTT, and the like. Inorganic materials with p+ and p++ doping levels include certain doped oxides and sulfides, such as molybdenum oxide, nickel oxide, copper aluminum sulfide, and the like. In certain embodiments the anode material may be impregnated with nanoparticles, e.g., organic polymeric materials impregnated with metal nanoparticles, such as silver nanoparticles may be used. Optionally the p+ or p++ anode material 111 may be in contact with a layer of conductor, such as metal 112, residing opposite the layer of semiconductor 109. In some embodiments highly conductive metals, such as Au, Ag, Cu, Al and the like, may be used in layer 112, in order to improve the device contacts. In other embodiments, the p+ or p++ material may be sufficiently conductive, and a metal layer 112 is not required.

According to a different embodiment, a cathode can include an n++ doped semiconductor material, while an anode can comprise a p++ doped material. The carrier concentration in the n++ layer is preferably at least about $10^{18}$ $cm^{-3}$. An energy level diagram for such p-i-n device is shown in FIG. 1C. The n++ cathode 113 has a band gap, characterized by a highest energy level in the valence band VB1 and the lowest energy level in the conduction band CB1. The broad-band semiconductor 115 and the p++ anode 117 energy levels are similar to those shown in FIG. 1B. Metal layers 119 and 121 may be optionally present adjacent the cathode 113 and the anode 121 respectively. These layers typically reside opposite the semiconductor layer 115. It is understood, however, that in some embodiments these layers may not be needed. The energetic considerations described above for energy diagrams depicted in FIG. 1A and 1B, equally apply to the device shown in FIG. 1C.

It is understood that the devices described herein can include additional layers, supplementing the three-layer structure described above. For example, both electrodes, as well as the broad band semiconductor layer can include additional sub-layers that can assist in tailoring the electronic properties of the device. For example an auxiliary layer of organic semiconductor can reside between the electrodes, e.g., as described in the commonly owned U.S. Provisional Application No. 60/857,750, previously incorporated by reference.

Two-Terminal Switch Structure

Figure 2:
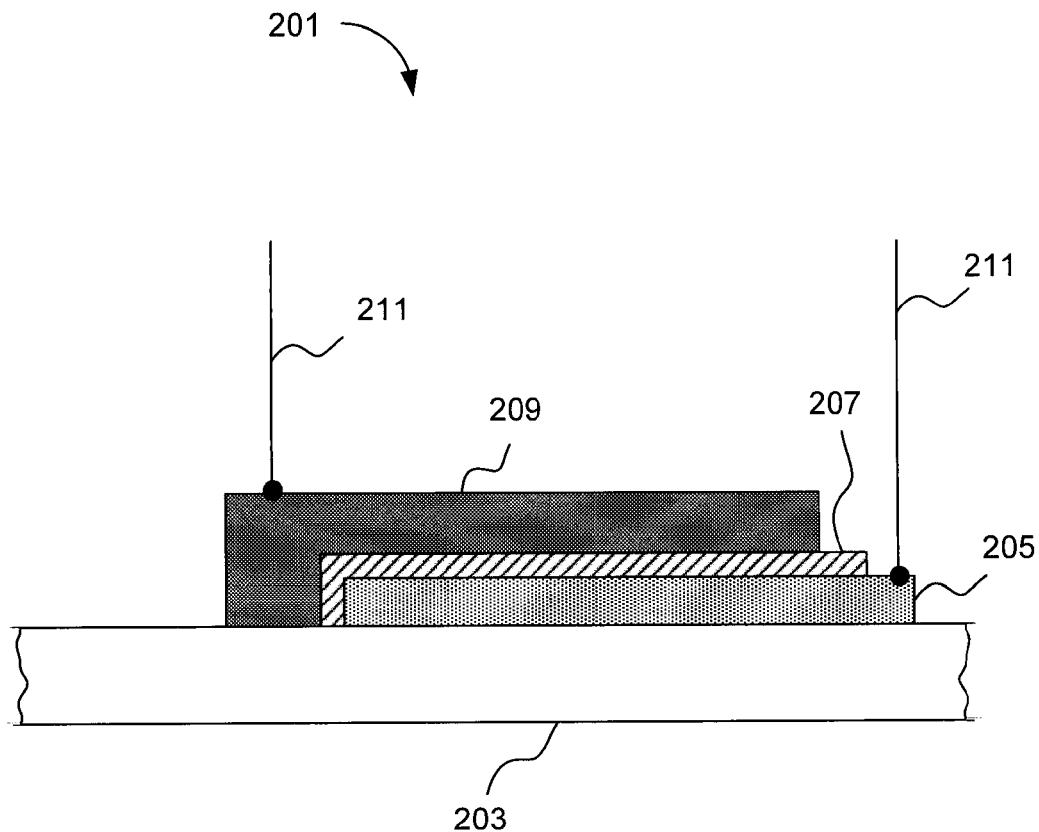
FIG. 2 is a cross-sectional depiction of a two-terminal switching device in accordance with one embodiment.

An example of a two-terminal switching diode, according to one embodiment of the present invention is shown in FIG. 2. In this embodiment, the switching diode is a three-layer device, with a broad-band semiconducting layer residing between two layers of conductive materials. It is understood, that in other embodiments the switching device may include additional layers, or any of the three layers may comprise two or more sub-layers forming a stack. A cross-sectional view of an example diode structure is presented. The diode 201 resides on a substrate 203 and includes a first electrode layer 205, a broad band semiconductor layer 207, and a second electrode layer 209. Electrical contacts 211 connect the electrodes 205 and 209 to address lines, a display element, other elements of a pixel control circuit, etc. In certain embodiments, the upper electrode is connected directly to a display element such as an electrophoretic display pixel.

In one embodiment, the electrode having a lower work function (typically a cathode where current is carried primarily by electrons) is shown as layer 205 and is formed directly on the substrate 203. The higher work function electrode (typically an anode) is shown as layer 209 and is formed on the layer of the broad band semiconductor 207. This structure has various advantages deriving from a relatively simple fabrication process. Specifically, in those embodiments where the cathode contains a metal, and the anode contains an organic material, it is often advantageous to form the metal cathode layer on a substrate, pattern the metal layer, then form a semiconductor layer on top of the cathode with or without patterning (e.g., by converting a top portion of the cathode metal to semiconductor) and finally deposit the organic anode material using a liquid phase processing, such as printing. It is often desirable to form organic-containing layers at the final stages of device fabrication, e.g., after the inorganic layers have already been deposited, in order to prevent inadvertent degradation of organic materials during deposition of other materials. Such a device can be processed at low temperature allowing a flexible, plastic substrate to be used as 203.

In an alternative embodiment, the higher work function electrode may be formed directly on a substrate, followed by formation of a semiconductor layer, and subsequent formation of a lower work function electrode. In this embodiment, layer 205 residing on a substrate 203, will comprise an anode material, e.g., a high work function organic or inorganic material with a p++ level of doping, while the top electrode 209, will comprise a cathode material, such as a low work function metal or a material having an n++ level of doping. In one embodiment, solution processing or other liquid phase processing can be used for cathode deposition. For example certain indium alloys with melting temperatures of between about 90° C. to 230° C. can be deposited using liquid-phase processing. In another example, a ZnO cathode is deposited using a sol-gel process.

This configuration may be implemented, particularly, in those embodiments where the anode does not comprise easily degradable organic materials.

The devices described herein can be fabricated in a variety of sizes. For example, switching diodes having a surface area of about 100 square microns and larger were prepared and were found suitable for active matrix display application. In addition, 10 by 40 μ, 150 by 150 μ and 1000 by 1000 μ devices were tested. The I-V characteristics of provided devices do not significantly change upon scaling, and constant Ion/Ioff ratios were obtained for devices of various sizes. Device area can be further minimized when lateral MIM devices are fabricated as described in the commonly owned U.S. Provisional Application No. 60/857,750 previously incorporated by reference.

Substrate

The substrate 203 is typically made of an insulating material that does not allow shorting of multiple switch devices residing on such substrate (e.g., as a matrix of switching devices). In certain embodiments, the substrate may include a conductive material (e.g., a metal), but in such cases a protective insulating coating is typically employed to prevent shorting of switches. Suitable substrate materials include glasses, crystalline wafers, polymeric materials (e.g., plastics) and stainless steel foils. For example, polyethylene-terephthalate (PET) can be used. Substrates can be either rigid or flexible. In certain embodiments substrates have a melting point, a glass transition point or a decomposition point lower than about 300° C., or lower than about 150° C., or even lower than about 100° C., which is possible because switch fabrication according to some embodiments of the invention does not include exposure to temperatures higher than 300 or 150, or even 100° C.

First Electrode

The first electrode (typically a cathode) usually comprises a material with a relatively low work function. In some embodiments, the cathode is the "bottom" electrode of the device structure, and is closest to the substrate. As was previously discussed, in alternative embodiments, it may be the "top" electrode, while the anode may reside at the substrate.

The first electrode typically comprises a metal or a metal alloy. A number of metals with relatively low work functions can be used. For example, metals selected from the group consisting of Mg, Ca, Sr, Ba, Ti, Ta, Al, In, Nb, Hf, Zn, Zr, Cu, Sn, V, Cr, Mn, Ga, Mo, Ni and Y can be employed. Rare earth metals such as Nd and Sm may be used in some embodiments. The cathode metals can be used either in pure form (e.g., about 95% pure), or in the form of alloys. Alloys of these metals with each other, such as TaAl, TiAl, TiTa, and MoAl or with other metals (e.g., TaW) and with non-metallic alloying materials may be used. Alloys can be formed, e.g., in order to tune the work function of the cathode or in order to increase the stability of the cathode. In some embodiments alloys with rare earth metals, e.g., with Nd, Sm, are employed, e.g., TaNd alloys, etc. In some embodiments the alloying material includes V and/or Nb. In some embodiments, multi-metal alloys, e.g., alloys including three or more metals may be used. In some embodiments anodizable corrosion resistant alloys, such as TiTa, MoAl, TaW, and MoAl are employed.

Reactive metals having particularly low work function, such as alkaline earth metals (Mg, Ca, Sr, and Ba) may require special packaging in some embodiments, to protect the formed devices from atmospheric moisture. In some embodiments, it is particularly preferred to use materials having a work function of less than about 4.5, e.g., less than about 4.2.

Metals and their alloys can be deposited by a variety of methods, including thermal evaporation, sputtering, electrodeposition, electroless deposition, etc. In some embodiments, metals are deposited on a substrate without raising the temperature of the substrate higher than about 100° C., e.g., higher than about 150° C. To facilitate fabrication, it may be desirable to use a metal that can be oxidized or otherwise modified to produce the semiconductor layer in situ.

Provided that the electronic considerations discussed above, are followed, other materials, beyond metals and their alloys, such as conductive metal oxides, certain conductive forms of carbon, certain doped semiconductors, can also be used as part of the cathode.

In those embodiments, where an n++/n-type/p++ device is fabricated, the cathode comprises a semiconductor material having an n++ type conductivity. Preferably, such materials have significant amount of ionic bonding, as compared to covalent bonding. Examples of such materials include certain conductive metal oxides, such as $Zn_xO_y$. Metal oxides can be deposited, for example, by sputtering, or by oxidation of a metal layer, (e.g., through anodization, chemical oxidation, plasma-assisted oxidation, etc.). Some oxides can be deposited using liquid phase techniques, e.g., using sol-gel processing.

While not critical to the invention, the thickness of the first electrode may impact certain applications or certain fabrication procedures. In certain embodiments, the thickness of the first electrode is between about 0.1 and 10 micrometers, or between about 0.2 and 2 micrometers.

Semiconductor Layer

In some embodiments, the broad band semiconductor layer comprises an inorganic material. In some examples, the semiconductor layer is entirely inorganic, and does not contain any organic material. In other examples, it may contain organometallic materials, hybrid organic-inorganic materials, metal complexes with organic ligands, etc. The semiconductor layer can be undoped or n-doped. N-type semiconductors are typically used in M/n-type/p++ and n++/n-type/p++ switching devices described herein. Examples of suitable semiconductors include stoichiometric and non-stoichiometric metal oxides, metal nitrides, and metal chalcogenides (e.g., metal sulfides, metal tellurides, and metal selenides), which can be used, e.g., in polycrystalline or amorphous form. For example, oxides, nitrides, or chalcogenides of Mg, Ca, Sr, Ba, Ti, Ta, Al, In, Nb, Hf, Sn, Zn, Zr, Cu, Fe, Ni, Mn, Cr, Au, Ag, Co, and Y metals can be used. The semiconductor layer can also include oxides, nitrides and chalcogenides of lanthanide metals, such as Nd, and Sm. In some embodiments, the inorganic semiconductor material is a metal oxide, selected from the group consisting of $Mg_xO_y$, $Ca_xO_y$, $Sr_xO_y$, $Ba_xO_y$, $Ti_xO_y$, $Ta_xO_y$, $Al_xO_y$, $In_xO_y$, $Nb_xO_y$, $Hf_xO_y$, $Sn_xO_y$, $Zn_xO_y$, $Zr_xO_y$, $Cu_xO_y$, $Y_xO_y$, $Y_xBa_yO_z$, and $Sm_xSn_yO_z$. In some embodiments, mixed oxides or inorganic nanocomposites are used in the broad band semiconductor layer. In some embodiments, blends and composites of the oxides, nitrides, and chalcogenides with each other or with other materials may be used. In some embodiments, the semiconductor layer includes doped insulating or semiconducting materials. The dopants may include small amounts of materials with a different number of valence electrons from the number of electrons in the bulk material, such as commonly used in semiconductor industry. Composite oxides, wherein one of the oxides in the composite serves as a dopant may also be used. In some embodiments, the carrier concentration in the semiconductor layer is lower than about $10^{17}$ $cm^{-3}$.

The broad band semiconductor layer can be formed, e.g., by a deposition technique such sputtering, chemical vapor deposition (CVD), atomic layer deposition (ALD) or by conversion of the top portion of the first electrode to an oxide or chalcogenide. Conversion techniques are described in detail in the commonly owned U.S. Provisional Application No. 60/857,750, was previously incorporated by reference. In some embodiments, it is preferred that the semiconductor material has a significant amount of ionic bonding, e.g., as in metal oxides.

The thickness of a broad-band semiconductor layer is an important parameter that may influence the electric performance of the switching device. Typically in diodes intended for display applications, the semiconductor layer is from about 15 to about 500 nm thick. For example, diodes with semiconductor layer thicknesses of 20-200 nm were fabricated and used. Of course, the actual thickness depends in part on the type of material employed as the broad band semiconductor. Note that for some embodiments, larger diodes with semiconductor layers of greater thicknesses than 500 nm may be desirable.

In certain embodiments inorganic material of the semiconductor layer may be blended with organic insulators or semiconductors to form a composite material. In other embodiments, a distinct layer of organic semiconductor material may be optionally added to the three-layer structure of the switch, such as layers described in the U.S. Provisional Application No. 60/857,750, previously incorporated by reference. For example, layers containing poly(3-hexylthiophene) (P3HT), poly(2-methoxy,5-(2'-ethylhexyloxy)-1,4-phenylene vinylene) (MEH-PPV), or organic molecules of carrier transport properties known in organic electronic device field (e.g., materials described in Zhigang Li and Hong Meng ed, "Organic Light-Emitting Materials and Devices", Taylor and Francis August 2006.) may be included as additional sublayers in the device structure.

In a specific embodiment, the semiconductor is an inorganic material having high level of ionic bonding. It will have a relatively low mobility (e.g., not greater than about 1 cm$^2$/Vsec), a relatively low carrier concentration (e.g., not greater than about $10^{17}$ cm$^{-3}$), and relatively large band gap (e.g., between about 2.5 and 4 eV). It will be a material that normally provides relatively few surface traps. Tantalum oxide, titanium-oxide and zinc oxide are examples of suitable semiconductors for this embodiment.

In some embodiments, the semiconductor layer is treated to remove surface defects prior to or concurrently with the deposition of the second conductive layer. Such removal of surface defects typically increases the energy barrier between the anode and the semiconductor layer, and results in lower leakage currents. In some embodiments, the exposed surface of the inorganic semiconductor (e.g., a metal oxide) is treated with an $O_2$ plasma, with proper thermal annealing in air or under controlled environment, or with an acidic solution or slurry to remove the surface defects.

In other embodiments, surface treatment occurs concurrently with deposition of the anode material. For example, in some embodiments, the conductive anode material may be inherently acidic. For example conductive organic materials can be doped with acidic sulphonate dopants, e.g., with poly (styrenesulphonate) PSS in a partially protonated form. Such acidic materials, when deposited on top of metal oxide-based semiconductors will cause a controlled amount of oxide surface etching, leading to improved surface quality and to fewer defects at the semiconductor layer/anode interface. In some embodiments, a controlled amount of acidic agent may be added during deposition of the anode conductive layer. In some embodiments, the surface of an inorganic semiconductor (e.g., a metal oxide) is contacted with a composition having a pH less than about 7, e.g., less than about 5, and in some embodiments less than about 4 prior to or concurrently with the deposition of the conductive anode material.

Second Electrode

The second electrode (typically an anode) comprises a layer preferably containing a conductive material having a relatively high work function (e.g., at least about 4.8, or at least about 5) and a p+ or p++ type conductivity. In certain embodiments, such materials are characterized by carrier concentration of at least about $10^{18}$ cm$^{-3}$.

In some embodiments, the second electrode contains a doped or undoped organic conductive material, such as conductive polymers and oligomers. Conductive substituted or unsubstituted polythiophenes (PT), such as poly(3,4-ethylenedioxythiophene) (PEDOT), polypyrroles (PPY), polyanilines (PANI), polythienothiophenes (PTT) and co-polymers thereof can be used. A variety of derivatives of these polymers can be employed. In some embodiments blends of neutral conjugated PFs, PPVs and PTs and conducting polythiophenes (doped polythiophenes), polyanilines and polypyrroles can be used in the second electrode. Examples of such blends are described in the U.S. Patent Application Publication No.: 2005/0154119, published Jul. 14, 2005, naming Robeson et al. as inventors, which is herein incorporated by reference in its entirety and for all purposes.

Organic conductive materials often include dopants that increase their conductivity. These dopants may be organic or inorganic. Preferred organic dopants include charged polymers, such as sulphonates and there protonated forms (e.g., PSS, DBSA, NAFION®) Commonly used conductive polymers include PEDOT:PSS and PANI:PSS combinations. PEDOT:PSS and PANI:PSS materials are commercially available from H. C. Starck, GmbH (Leverkusen, Germany). Other suitable dopants include certain metal oxides (e.g., $TiO_2$,), dimethylsulfoxide (DMSO), and carbon black, which are commonly used in, for example, PPY:$TiO_2$, PPY:Carbon black and PEDOT:DMSO combinations. For a given dopant material, the carrier density on the conducting polymer chains can be tailored with liquid additives such as ethanol, or ethylene glycol. Advantageously, the work function of organic molecules can be tailored by modifying the dopant nature and concentration. For example, PEDOT, PANI and PPY based conducting polymers can be tailored using methods similar to those described in U.S. Patent Application Publication No. 2005/0224788, published Oct. 13, 2005, naming Hsu et al. as inventors; U.S. Patent Application Publication No 2005/0227081, published Oct. 13, 2005 naming Hsu et al. as inventors and in WO application publication No. 2005/090434, published Sep. 29, 2005, naming Hsu et al. as inventors, all of which are herein incorporated by reference. The work functions of such films, in some embodiments can be as high as about 5.2-5.8 eV.

In some embodiments, organic polymers, such as PTT, are provided as aqueous dispersions with colloid-forming polymeric acids. For example, aqueous dispersions of poly(thieno [3,4-b]thiophenes) and partially fluorinated ion exchange polymers, can be used for forming the anode conductive layers. Such materials are described in detail in the U.S. Patent Application Publication No. 2006/0076557, published Apr. 13, 2006, naming Waller et al. as inventors, which is herein incorporated by reference in its entirety and for all purposes. In some embodiments, the pH of these compositions can be adjusted as desired, e.g., through blending with neutral polymers such as poly(methyl methacrylate), PMMA, or poly(vinyl alcohol), PVA. In some embodiments, slightly acidic compositions (e.g., with pH ranging from about 3 to about 7) are preferred for surface cleaning of a metal oxide semiconductor layer.

Further, in some embodiments, substituted or unsubstituted polyfluorenes, poly(3-hexylthiophene)s, polynaphthalenes, poly(para-penylene vinylene)s, poly(para phenylene)s and their derivatives or copolymers can be doped to such a level as to meet the electronic requirements for the anode conductive layer.

According to some embodiments, materials used for second electrode layer are soluble in a polar or a non-polar solvent. Polar or non-polar organic solvents, such as alcohols (e.g., methanol), acetone or hydrocarbon solvents may be used to deliver the above mentioned materials using liquid-phase processing. Materials that are water-soluble or that are soluble in organic/aqueous solutions, such as aqueous alcohols are also used in some embodiments. Such liquid media may be used, in some embodiments, to form the organic-containing second electrode by liquid phase processing. In some embodiments, dispersions and colloids of conductive polymers in a variety of liquid media (e.g., aqueous dispersions) can be prepared and applied in liquid-phase processing.

Organic materials are often preferred anode materials due to their relatively high work function and reduction of Fermi level pinning effect. Further, deposition of organic material often does not require expensive and laborious processing. For example, in some embodiments, the organic material may be deposited in a pattern (e.g., by printing) without the need for a separate patterning operation.

It is understood, however, that in some embodiments, inorganic materials having a p-type conductivity with high carrier concentrations (p+, and p++), may be employed. Preferably, inorganic materials with high degree of ionic bonding, rather than with covalent bonding are used. These materials include certain p-doped metal oxides and metal sulfide materials, known to those of skill in the art. For example, zinc-doped copper aluminum sulfide, such as $Cu_xAl_yZn_zS_w$, or a doped copper selenide, such as $Cu_xIn_yGa_zSe_w$ may be used. Another example of p-type inorganic materials includes certain metal oxides and sulfides, such as molybdenum oxide and nickel oxide based materials, e.g., non-stoichiometric $Mo_2O_{3-\delta}$, $Ni_xO_y$, $ZnO_{1-x}S_x$, $Cu_2O$ and $CuO$.

While in some embodiments, highly doped semiconductors with covalent type of bonding (e.g., p++ silicon and p++ germanium), can be used as anode materials, in many embodiments their use is not desired due to difficulties in their processing. (e.g., requirement for patterning and high-temperature processing).

The thickness of the second electrode, similarly to the thickness of the first electrode is not critical and can be from hundreds of Angstroms to hundreds of microns or thicker. For certain applications, the thickness of the second electrode is in the range of about 0.03 to 10 micrometers, or about 0.1 to 1 micrometers.

Methods of Fabrication of Two-Terminal Switch Structure

As mentioned, a variety of methods can be used to form two-terminal switching devices. In some embodiments, it is advantageous to use liquid-phase processing to form at least one layer of the device. Specifically, it is especially advantageous to form the top electrode by this method. Thus, in one embodiment, an anode layer containing organic material can be deposited using liquid phase processing, such as printing.

Figure 3A:
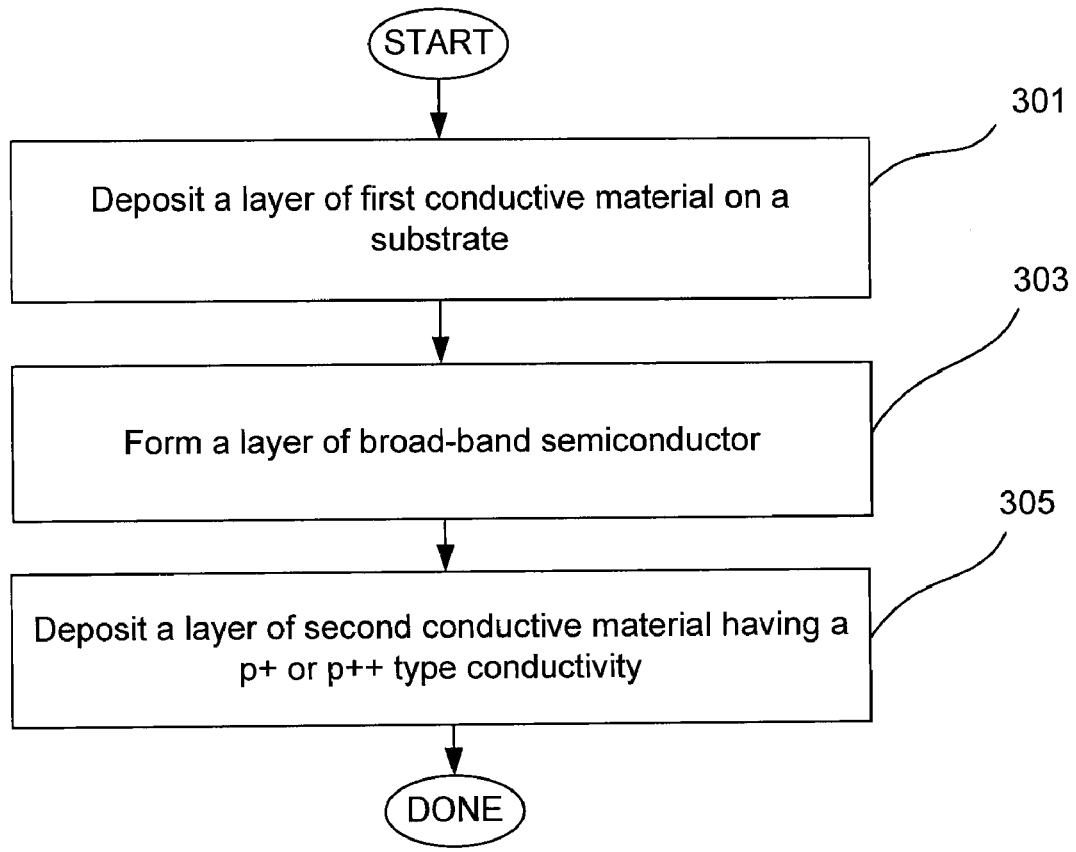
FIGS. 3A-3C present example process flow diagrams for processes of fabricating two-terminal switching devices in accordance with several embodiments described herein.

One example of a fabrication method of a two-terminal switch in accordance with certain embodiments of the invention is illustrated in FIG. 3A. This example refers to a switching device that has a cathode layer residing on a substrate, a layer of broad-band semiconductor residing on the cathode, and an anode layer residing on top of the structure.

Referring to FIG. 3A, a layer of first conductive material is deposited onto a substrate in the first operation 301. A variety of deposition methods can be used. These include PVD methods, such as sputtering and evaporation (including thermal evaporation, electron beam evaporation and the like), thermal deposition, CVD methods, plasma-enhanced (PECVD) methods, and photo-organic deposition methods (PODM), all well known to those skilled in the art. In selected embodiments electroplating and electroless deposition methods can be used, where appropriate. In other embodiments, printing can be used. For example, a variety of metals, such as Ti, Ta, Al etc. can be thermally deposited; certain metals, such as Cu, Cr or Ni can be electroplated or electrolessly deposited; while some metals, can be printed on a substrate and then subjected to thermal post-treatment. Other materials, such as n++ conductive oxides can be deposited by liquid-phase processing methods or by sputtering. In some embodiments, the deposition of the first conductive material is performed without heating the substrate to a temperature of greater than about 300° C., 150° C., or 100° C. For example, sputtering or evaporation can be performed, while maintaining the substrate at a temperature of less than about 100° C.

If necessary, the conductive layer deposited on a substrate is patterned using conventional patterning methods (e.g., lithography techniques), and a broad band semiconductor layer is formed over at least a portion of the first conductive layer in the following operation 303. Several methods can be used to form the broad band semiconductor layer. In some embodiments, a portion of the first electrode is modified by, for example, chemical, plasma or electrochemical treatment. According to some embodiments, an upper portion of the first electrode metal layer can be anodized to form metal oxide. These methods are described in detail in the commonly owned U.S. Provisional Application No. 60/857,750 previously incorporated by reference. It is often advantageous to use transformation of a portion of an underlying cathode for forming the broad band semiconductor layer, since the semiconductor can be formed conformally over the surface of a cathode, and, hence, No additional patterning steps of semiconductor material may be required. Alternatively, the semiconductor material may be deposited by PVD, CVD, and PECVD methods. It can subsequently be patterned to reside at individual devices. In other embodiments, the semiconductor layer may remain unpatterned and can span between several devices. In one of PVD embodiments, metal oxide, is deposited by sputtering. During sputtering, metal is sputtered off the metal-containing target, reacted with an oxygen-containing gas in the PVD process chamber and is deposited upon the substrate containing the exposed cathode material. Alternatively, a semiconductor compound (e.g., metal oxide) can be sputtered without substantial modification form from the target to the substrate. Such deposition method advantageously allows depositing a variety of metal oxides, e.g., oxides of metals that are different from the metals contained in the exposed cathode material. For example, a tantalum oxide film can be sputter deposited over a Mg-containing cathode. In some embodiments, the deposition of the semiconductor material is performed without heating the substrate to a temperature of greater than about 300° C., 150° C., or 100° C. For example, sputtering or anodization can be performed, while maintaining the substrate at a temperature of less than about 100° C.

Referring again to FIG. 3A, the process follows by depositing a layer of a second material (an anode material) having a p+ or p++ type conductivity. As mentioned, a variety of p-type organic conductors can be used as electrode materials. These can be deposited by liquid phase processing methods, such as printing, spin coating, spray coating, immersion, etc. The layer of organic material can be deposited in a pattern (e.g., by printing), such that an additional patterning operation will not be required. Alternatively, a blanket layer of organic material can be deposited, and the anode may be subsequently patterned. Liquid phase deposition methods suitable for anode formation are described in detail in the commonly owned U.S. Provisional Application No. 60/857,750 previously incorporated by reference.

When the anode material having a p+ or p++ conductivity is an inorganic material, such as $Cu_xAl_yZn_zS_w$, $Ni_xO_y$, or $Mo_xO_y$, $ZnO_{1-x}S_x$, $Cu_2O$, $CuO$, it can be deposited by methods, such as PVD, CVD, PECVD, and, in some cases, by spin coating. In some embodiments, inorganic p++ materials are deposited using a liquid-phase processing method. For example, solutions or suspensions of metal oxide precursors (e.g., organometallic precursors) can be applied to the semiconductor layer and then converted to a p++ metal oxide. For example, a p++ molybdenum oxide layer can be formed by applying a solution of molybdenum isopropoxide to the substrate, followed by a thermal treatment. Inorganic p++ anodes can be formed, in some embodiments, without heating the substrate to a temperature greater than about 300° C., or greater than about 200° C. Therefore, devices having inorganic p++ anodes can be fabricated using plastic and flexible substrates with low melting points.

Prior to the anode deposition, a surface treatment process (e.g., oxygen plasma, thermal annealing under controlled chemical environment, rinse or bath in a liquid chemical solution) can be used to reduce or compensate for the surface trap states. After such optional treatment of the semiconductor surface, the inorganic material is deposited and is typically patterned after deposition.

In some embodiments, the deposition of the second conductive material is performed without heating the substrate to a temperature of greater than about 300° C., 150° C., or 100° C. For example, printing, sputtering and spin coating operations can be performed, while maintaining the substrate at a temperature of less than about 100° C.

Figure 3B:
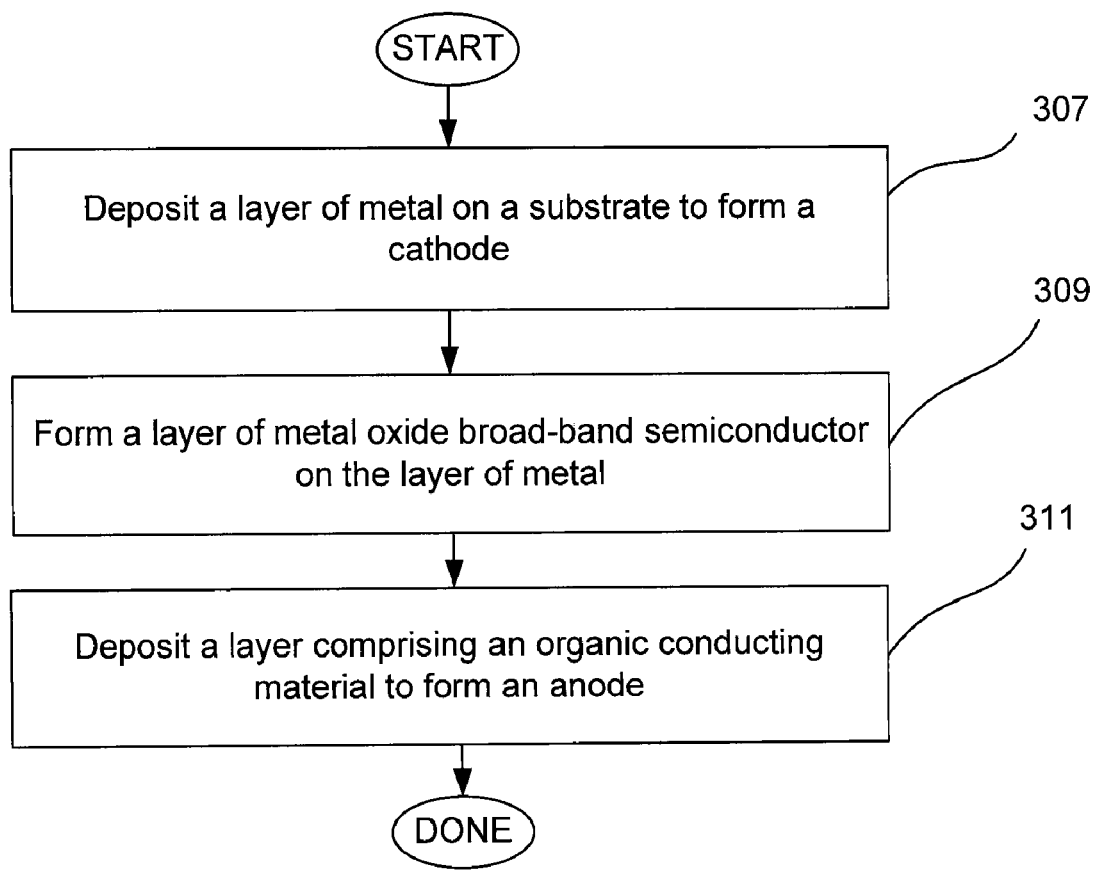

FIG. 3B presents a process flow diagram for a specific embodiment of a method shown in FIG. 3A. In this embodiment the process starts by operation 307, in which a layer of metal is deposited on a substrate forming a cathode. Typically, a low work function metal such as Mg, Ca, Sr, Ba, Ti, Ta, Al, V, Mn, Ga, In, Nb, Hf, Zn, Zr, and Y is deposited. In some embodiments, metals with medium work functions, such as Cu, Ni, Cr, Mo and Sn may also be used. In some embodiments, rare earth metals, such as Sm and Nd may be used as cathode materials. Alloys of these metals with each other, and with different alloying materials are also employed.

After the cathode material has been deposited, a layer of metal oxide is formed on the layer of metal in an operation 309, e.g., by transforming the top portion of the metal layer through anodization or by sputtering. The process follows in 311 by depositing a layer comprising an organic conducting material to form an anode, typically by a liquid phase processing method such as printing.

Figure 3C:
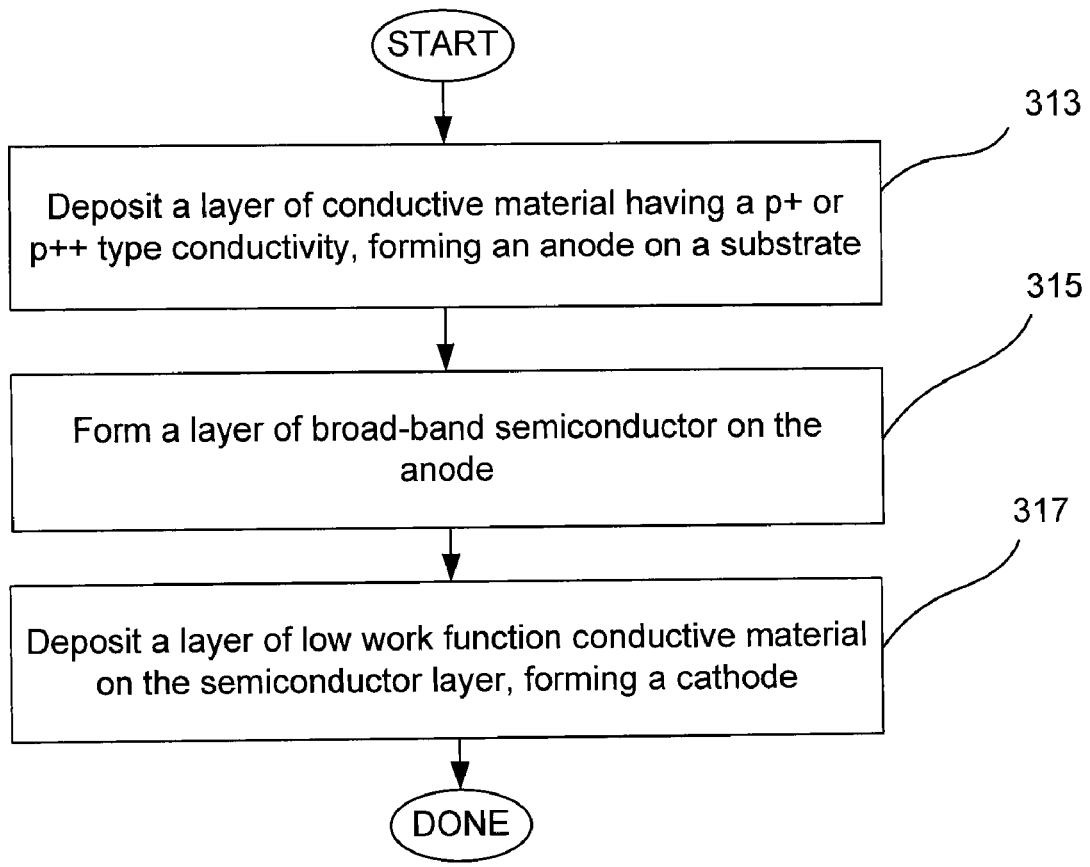

An alternative embodiment for a device fabrication process is illustrated in the process flow diagram of FIG. 3C. In this case, the device comprises an anode residing on a substrate, a top cathode layer, and a layer of broad band semiconducting material residing between the electrodes. The process starts by depositing a layer of conductive material having a p+ or p++ type conductivity to form an anode, as shown in operation 313. Organic or inorganic p-type conductors, described above can be used. As described previously, organic conducting materials can be deposited by liquid processing methods, while inorganic p-type conductors can be deposited by methods, such as PVD, CVD, PECVD, and, in some cases, by liquid processing methods, such as spin coating. The anode material is deposited in a pattern (e.g., by printing), or is patterned after the deposition to define the individual devices. The process follows by forming a layer of broad band semiconductor in an operation 315. For example, a metal oxide semiconductor material can be sputtered over a layer of an inorganic p-type conductor, such as doped copper aluminum sulfide. The semiconductor layer is preferably patterned, and the process is completed by depositing a layer of cathode material in an operation 317. The cathode material is typically a low work function metal or alloy, which can be deposited by, e.g., evaporation or sputtering, and , in some cases by liquid processing methods, e.g., by liquid-phase deposition of low-melting indium alloy cathode, or by a sol-gel deposition of a ZnO cathode. The formed anode will then need to be patterned, in order to form the individual devices.

Matrix

The switching devices disclosed herein may be employed in a variety of column-row (x-y) addressable electric switch matrixes. Such matrixes may employ micro-switches, which are two terminal devices through which electric current, electric potential or their derivatives or integrals can be switched on and off by the magnitude or the polarity of an external bias. Column-row addressable electric micro-switch matrices can be made to cover large areas, with high pixel density. Such matrices can be integrated with one (or several) additional layer(s) such as display front planes.

Integration of switching devices into pixel control circuits has been described in detail in U.S. Published Patent Application No. 2004/0179146, filed Jan. 16, 2004, naming Nilsson as inventor, previously incorporated by reference, and will not be further discussed herein. Examples of pixel electrode designs and corresponding driving scheme were disclosed in U.S. application Ser. No. 11/430,075, filed May 8, 2006 naming H. -C. Lee et al. as inventors and in U.S. application Ser. No. 11/650,148, filed Jan. 5, 2007 naming C. -L. Shieh et al. as inventors which are both herein incorporated by reference for all purposes.

Generally, a plurality of the inventive two-terminal devices may be disposed on a substrate and electrically connected by conductive lines such as wiring. As mentioned above, the substrate may comprise a dielectric material to electrically isolate the devices one from another. The plurality of devices will typically, though not necessarily, share the same electrical orientation with respect to the substrate. In other words, all the devices will have the cathode located proximate the substrate and the anode located opposite from the substrate. In other embodiments, all the devices will have a reverse orientation, with the anode located proximate the substrate and the cathode located opposite the substrate.

In certain embodiments, some or all of the plurality of two-terminal devices will share a continuous semiconductor layer. In such embodiments, the continuous semiconductor layer will span at least two devices without a physical break. In certain embodiments, at least some of the plurality of two-terminal devices will not share a continuous semiconductor layer. Instead, one or more of the devices will be isolated from others of the plurality of devices in that that they do not share the semiconductor layer, and they do not share one or both electrode layers with any other device on the substrate.

In certain embodiments, the plurality of devices on the substrate forms a column-row addressable electric switch matrix. The devices may be arranged in an array of devices on the substrate. As a specific example, the plurality of devices is configured as a backplane for a display. To this end, the two-terminal switching devices may be configured to regulate light from a pixel of the display, with the devices being integrated in a plurality of pixel control circuits. Examples of displays that may be used with two-terminal devices of this invention include electrophoretic displays, rotating element displays, and liquid crystal displays.

EXAMPLES

Several examples of device compositions are herein illustrated in a cathode/semiconductor layer/anode format:

Ta/Ta$_2$O$_{5-\delta}$/PEDOT:PSS;
Mg/Ta$_2$O$_{5-\delta}$/PEDOT:Ag;
Ta/Ta$_2$O$_{5-\delta}$/MEH-PPV/PEDOT:PSS;
Mg/Ta$_2$O$_{5-\delta}$/Zn$_x$Cu$_y$AlzSw;
ZnO/Ta$_2$O$_{5-\delta}$/PEDOT:PSS.

Other devices can be configured using a variety of material combinations, e.g., using materials presented in Table 1 and Table 2.

TABLE 1

Electronic properties of materials suitable for a two-terminal device with an organic anode.

| Cathode | Semi-conductor Ec/Ev; Δ1 (eV) | Anode | | | |
| --- | --- | --- | --- | --- | --- |
| | | PEDOT:PSS Δ3 (eV) Δ4 (eV) | PANI:I Δ3 (eV) Δ4 (eV) | PPY Δ3 (eV) Δ4 (eV) | PTT:NAFION ® Δ3 (eV) Δ4 (eV) |
| Ta | Ta$_x$O$_y$, 3.9/7.9; ~0.3 | 0.0 1.3 | 0.4 1.1 | 0.7 0.8 | −0.5 1.7 |
| Ti | Ti$_x$O$_y$, 4.3/7.4; ~0.1 | 0.3 1.0 | 0.7 0.8 | 1.0 0.8 | −0.1 1.3 |

TABLE 1-continued

Electronic properties of materials suitable for a two-terminal device with an organic anode.

| Cathode | Semi-conductor Ec/Ev; Δ1 (eV) | Anode | | | |
|---|---|---|---|---|---|
| | | PEDOT:PSS Δ3 (eV) Δ4 (eV) | PANI:I Δ3 (eV) Δ4 (eV) | PPY Δ3 (eV) Δ4 (eV) | PTT:NAFION ® Δ3 (eV) Δ4 (eV) |
| Zn | $Zn_xO_y$ 4.3/7.3; ~0.1 | 0.3 1.0 | 0.7 0.8 | 1.0 0.5 | −0.1 1.3 |
| In | $In_xO_y$ 4.1/7.6; ~0.1 | 0.2 1.1 | 0.6 0.9 | 0.9 0.6 | −0.3 1.5 |
| Zn | $Zn_xS_y$ 4.1/7.6; ~0.2 | 0.2 1.1 | 0.6 0.9 | 0.9 0.6 | −0.3 1.5 |

Table 1 illustrates several combinations of materials that can be used in two-terminal switching devices in accordance with electronic guidelines presented herein. Lowest conduction and highest valence energy levels (Ec/Ev) are listed for the semiconductor materials. Energy barriers Δ1, Δ3, and Δ4, described with reference to FIG. 1B are also listed. Table 1 presents electronic properties for example materials, and illustrates devices with organic p++ anode. A number of organic materials having a p++ type conductivity and suitable as anodes, are presented. The carrier densities in PEDOT:PSS, PANY:I; PPY; and PTT:NAFION® are greater than $10^{18}$ cm$^{-3}$. The highest valence energy/lowest polaron energy ratios (Ev/Ep) are 5.2/3.9; 5.0/3.5; 4.7/3.2; and 5.6/4.4 respectively for these polymers.

Table 2 illustrates several combinations of materials for devices having an inorganic p++ anode. Inorganic p++ materials $Mo_xO_y$, $Ni_xO_y$, and $Cu_xIn_yGa_zSe_w$ have very high carrier concentrations of greater than about $10^{19}$ cm$^{-3}$. Ec/Ev values for these materials are 5.3/2.2; 5.3/2.3; and 5.0/3.7 respectively. Note that although some devices with inorganic cathodes are characterized by relatively high Δ3 values, it does not significantly affect the device performance due to relatively high carrier concentration in the anode (greater than about $10^{19}$ cm$^{-3}$).

TABLE 2

Electronic properties of materials suitable for a two-terminal device with an inorganic anode.

| Cathode | Semiconductor Ec/Ev; Δ1 (eV) | Anode | | |
|---|---|---|---|---|
| | | $Mo_xO_y$ Δ3 (eV) Δ4 (eV) | $Ni_xO_y$ Δ3 (eV) Δ4 (eV) | $Cu_xIn_yGa_zSe_w$ Δ3 (eV) Δ4 (eV) |
| Ta | $Ta_xO_y$ 3.9/7.9; ~0.3 | 1.7 1.4 | 1.6 1.4 | 0.2 1.1 |
| Ti | $Ti_xO_y$ 4.3/7.4; ~0.1 | 2.1 1.0 | 2.0 1.0 | 0.5 0.7 |
| Zn | $Zn_xO_y$ 4.3/7.3; ~0.1 | 2.1 1.0 | 1.3 1.0 | 0.5 0.7 |
| n | $In_xO_y$ 4.1/7.6; ~0.1 | 0.7 1.2 | 1.1 1.2 | 0.4 0.9 |
| Zn | $Zn_xS_y$ 4.1/7.6; ~0.2 | 0.7 1.2 | 1.1 1.2 | 0.4 0.9 |

Experimental Examples

A number of two-terminal switching devices have been prepared. Experimental methods used in device fabrication will now be illustrated. Methods used for determining electronic properties of various device materials will also be presented.

Example 1

Organic p++ Materials Suitable for Anode Fabrication

Carrier concentrations were measured for several p++ materials. One example material for which carrier concentrations were determined was PEDOT:PSS, which was purchased from H. C. Starck Chemical (available as BAYTRON P®). The electronic properties of aqueous colloid suspensions of PEDOT having different levels of PSS doping were determined. PEDOT/PSS ratios ranged from between 1:1 to 1:20. Table 3 lists materials used in this study, conductivity of these materials and their carrier densities. It can be seen that conductivity of these materials ranged from about $10^{-2}$ S/cm to about $6 \times 10^2$ S/cm.

TABLE 3

Electronic parameters of PEDOT:PSS

| ID | PEDOT:PSS | Conductivity (S/cm) | Carrier density (cm$^{-3}$) |
|---|---|---|---|
| 1 | BAYTRON P PH500 ® | ~300 | ~4 × $10^{21}$ |
| 2 | BAYTRON P PH ® | ~0.3 | ~3 × $10^{18}$ |
| 3 | BAYTRON Al 4083 ® | ~$10^{-2}$ | ~1 × $10^{18}$ |
| 4 | BAYTRON P PH ® + 5% DMSO | 20-50 | 1-3 × $10^{20}$ |

In one example, 100 nm thick PEDOT:PSS (product ID: BAYTRON P PH500®) films were spin-cast onto glass substrates coated with indium-tin-oxide. Electrochemical reduction-oxidation experiments were carried out by varying the bias voltage, and then allowing sufficient time for the current to diminish (corresponding to each redox (doping) level). At different reduction and oxidation levels, the tested films were peeled off the carrier glass and transferred to a quartz substrate for optical transmission measurement. For a voltage below −1.5 V bias, the absorption spectra revealed an intrinsic semiconductor with absorption maximum at ~2.1 eV and an onset of absorption at 1.7 eV (corresponding to the energy gap in PEDOT). No residual absorption was traceable in the optical gap. The "open-circuit" voltage in fresh PEDOT:PSS was ~+0.4 V, which confirmed that the Fermi-energy of the doped PEDOT:PSS was ~5.0 eV. The absorption in doped PEDOT:PSS revealed that the density of states above LUMO (~3.5 eV) and below HOMO (~5.0eV) were shifted into p-type polaron states in between the energy gap.

The density of charge carriers was estimated from (1) an empirical relation between N and $N_{dopant}$ inferred from a Hall effect measurement (N. Camaioni et al., Applied Physics Letters 73, 253 (1998)), and (2) bulk conductivity. Carrier densities of about $10^{18}$-$10^{21}$ cm$^{-3}$ were obtained (as listed in Table 3). These results are consistent with the values inferred from free-carrier absorption profile and plasma frequency in infrared spectroscopic measurement (K. H. Lee et al., Phys. Rev. B52, 4779 (1995)).

Other tested conductive polymers included conducting polypyrrole (CAS No. 577030, obtained from Aldrich, Milwaukee, Wis.), electrochemically synthesized PPY:PF6 film (synthesized following C. O. Yoon et al., Phys. Rev. B49, 10851 (1994)), PANI:PSS and PANI:DBSA films (prepared following Y. Cao et al., Phys. Rev. B48, 17685 (1994)). These materials were tested by means of bulk conduction and IR absorption measurements. Carrier concentrations between $10^{18}$ and $4\times10^{21}$ cm$^{-3}$ were obtained This example demonstrated that conjugated polymers, doped with, e.g., sulfonates are heavily doped p-type semiconductors with carrier concentration (dopant concentration) larger than $10^{18}$ cm$^{-3}$.

Example 2

Ta/TaO/PEDOT:PSS Two-terminal Switching Device

Ta metal was sputtered using a DC sputtering apparatus either on a glass or on a plastic substrate at room temperature. The thicknesses of Ta films ranged from about 170 to about 500 nm. Upon deposition, the tantalum film was anodized to convert the top portion of tantalum to tantalum oxide. Anodization was conducted using 0.01 M aqueous citric acid solution as an electrolyte component. A stainless steel plate served as the anode counter electrode. The space between the two plates was 4 cm. The anodization procedure was carried out at 25° C. and comprised the following steps. The anodization was started in a constant current mode, with the current density of about 0.2 mA/cm$^2$. After a voltage of 17.5 V was reached (corresponding to formation of ~30 nm film), anodization was switched to a constant-potential regime. Anodization was stopped after current dropped below 10 μA/cm$^2$. The anodized partially fabricated device was cleaned in an ultrasonic bath in acetone for 5 minutes, followed by a 5 minute ultrasonic bath treatment in isopropanol. The device was then heated at about 120° C. for 20 minutes to anneal the formed oxide. Tantalum oxide serves as a broad band semiconductor layer in this device.

Figure 4:
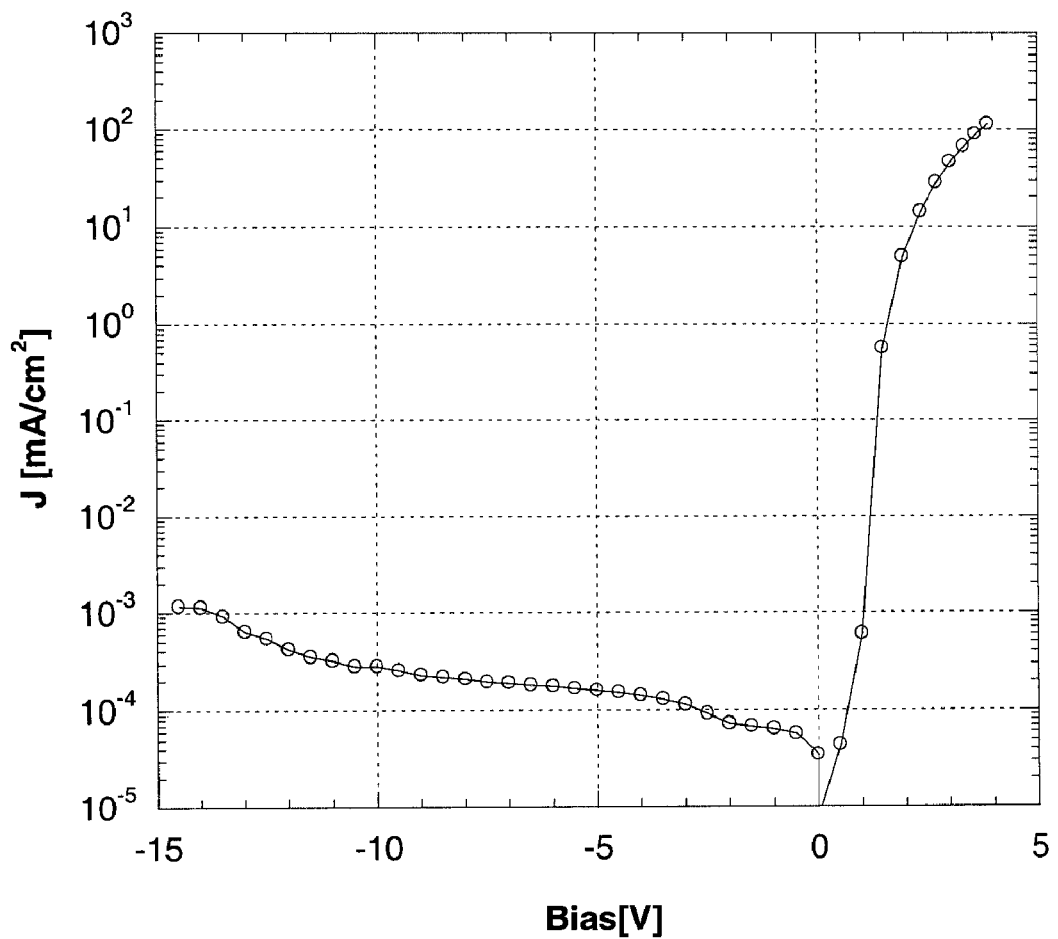
FIG. 4 is a plot of I-V characteristics of Ta/Ta$_2$O$_{5-\delta}$ (30 nm)/PEDOT:PSS diode. Forward bias is defined as higher potential applied to PEDOT:PSS.

After the tantalum oxide has been formed, the anode deposition followed. Then anode electrode was formed by dispensing 3 wt % solution of PEDOT:PSS (H. C. Starck, BAYTRON P PH500®) with a needle nozzle onto the top portion of Ta$_2$O$_{5-\delta}$. The sample was then baked at 80-120° C. for 20-40 minutes. The sizes of the test devices were varied in the range of $10^{-4}$-$10^{-1}$ cm$^2$. The device current was scaleable to the device area and a universal current density was observed. A rectifier type I-V relationship was observed, as shown in FIG. 4, which presents a plot of current density versus voltage for the formed device. The forward current (obtained when applying high voltage to PEDOT electrode) increases exponentially at a voltage of ~1 V. The forward current increase rate slows down for J>1 mA/cm$^2$, reaches 10 mA/cm$^2$ at ~2.2 V and 100 mA/cm$^2$ at ~4V. When reverse bias is applied, current saturation is quickly reached. It can be seen that reverse current having a density of about 0.5-1×10$^{-3}$ mA/cm$^2$ is achieved at −15 V bias. The rectification ratio at 4V (defined as forward current divided by the reverse current at a given voltage bias) is ~10$^6$, which meets the need of driving a liquid-crystal display panel [in pp. 281-287, "Liquid Crystal Displays: Addressing Schemes and Electro-Optical Effects", by Ernst Lueder, Wiley (2001) which is herein incorporated by reference in its entirety for all purposes]. The current switch ratio R=I(4V)/I(−15V) is typically in the 10$^4$-10$^5$ range, which meets the requirement to drive a display panel made with a EPD film.

This experiment was repeated with different Ta$_2$O$_{5-\delta}$ thicknesses ranging between ~20 nm to ~100 nm. Two-terminal switching devices with asymmetric I-V characteristics similar to those shown in FIG. 4 were obtained. Although the forward current decreases in devices with thicker Ta$_2$O$_{5-\delta}$ films, the high current switch ratio of 10$^4$-10$^5$ was observed for devices having a Ta$_2$O$_{5-\delta}$ thickness in the range of about 20-80 nm.

This experiment was repeated with the PEDOT:PSS ink (BAYTRON P PH®) blended with water suspensions that included silver nanoparticles, gold nanoparticles or carbon black particles. The process procedure and process conditions were not changed. Switching I-V characteristics similar to those shown in FIG. 4 were observed.

In a pixel circuit design, it is sometimes desirable to use different conductor materials for wires. For this purpose, a conductive silver layer and a conductive gold layer were printed on top of the PEDOT anode layer. The I-V characteristic exhibited no change after application of the conductive layer. This finding confirms that a stable ohmic contact can be formed between a metal (such as Au, Ag) and the conducting polymer anode.

This example demonstrates that a solid state switch device with a switch ratio I(4V)/I(−15V) larger than 10$^4$ can be fabricated using low-temperature processing.

This example also demonstrates that switching I-V characteristics can be achieved in a device having a p-type organic anode having a carrier concentration of greater than about $10^{18}$ cm$^{-3}$.

This example further demonstrates that two terminal switch devices can be made with the top electrode fabricated by liquid-phase processing.

This example also demonstrates that the thin-film switch diode can be made at temperature below 120° C.

Example 3

Device Reproducibility and Uniformity

The experiment of Example 2 was repeated with an array of devices on a 3"×3" substrate. The area of each test device was 4×10$^-$cm$^2$. 16 devices in 1.5"×1.0" area were picked for this test. The I-V profile and the switch ratio were consistent with mean variation of less than about a few percents. The reproducibility of I-V characteristics for a large number of devices confirmed the reliability and uniformity of anodization process over large area.

This example demonstrated that the devices disclosed in this invention and the corresponding processes are stable and can be fabricated reprodicibly.

Example 4

Energy Barrier Determination Between TaO and PEDOT:PSS

Figure 5:
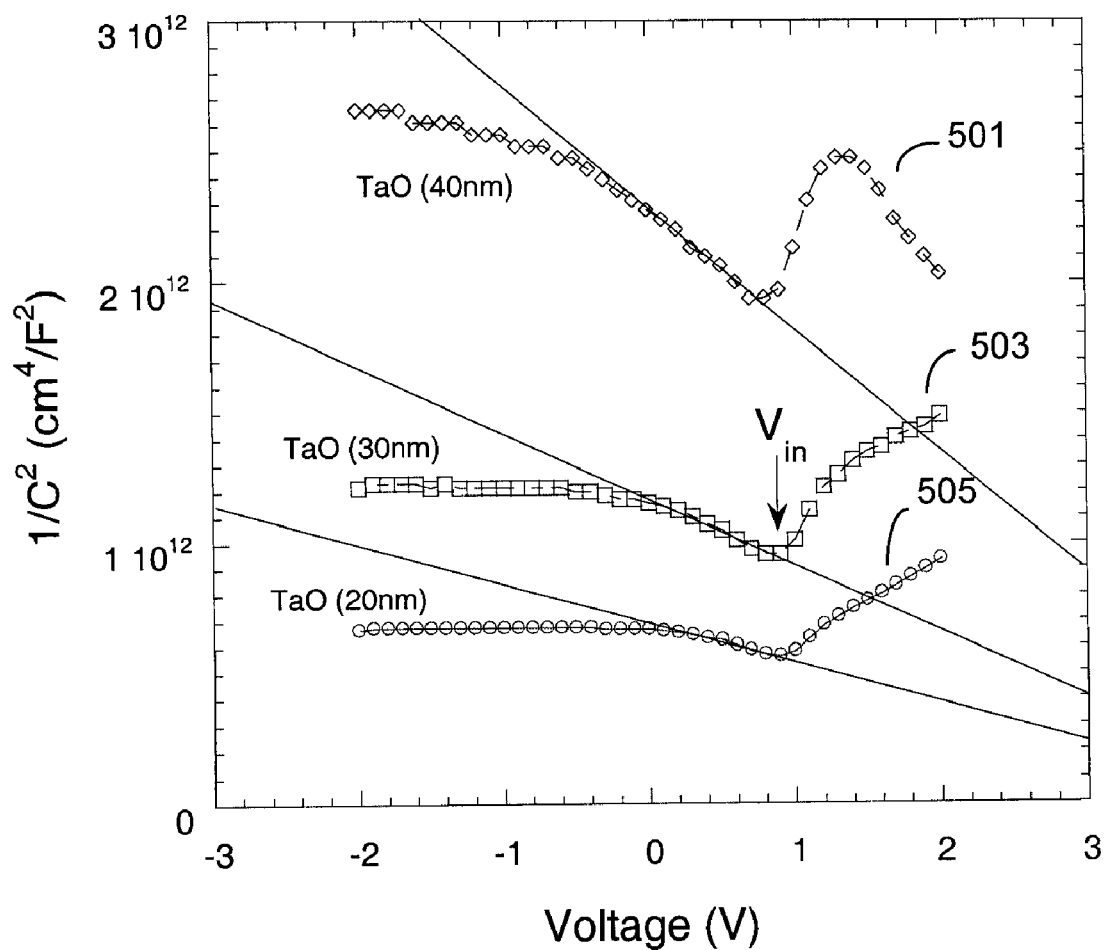
FIG. 5 is a $1/C^2$ vs. voltage plot for Ta/Ta$_2$O$_{5-\delta}$ (30 nm)/PEDOT:PSS devices having 40 nm, 30 nm, and 20 nm thick Ta$_2$O$_{5-\delta}$ layers (curves 501, 503, and 505 respectively)

Impedance analysis was carried out with a Ta/TaO/PEDOT:PSS device similar to the device used in Example 2. The capacitance as function of biasing voltage is plotted in the form of 1/C$^2$ vs V in FIG. 5 for a device having a 40 nm thick TaO film (curve 501), 30 nm thick TaO film (curve 503) and 20 nm thick TaO film (curve 505). A built-in potential of ~1 eV was extrapolated from the plot based on Schottky diode model (S. M. Sze, in "Physics of Semiconductor Devices", 2$^{nd}$ Edition, p. 249, John Wiley and Sons, 1981). The obtained value is close to the energy difference between Ec of TaO (~3.9 eV) and the work function of the PEDOT film (5.0 eV, see example 1). This barrier is in fact consistent with the onset of exponential current turn-on observed in forward bias (as seen in FIG. 4).

This example demonstrated that a large blocking contact (large energy barrier) exists between the n-type TaO thin film and the p-type organic semiconducting polymer film.

Example 5

Self-surface Cleaning Effected with Doped Conducting Polymer

Figure 6:
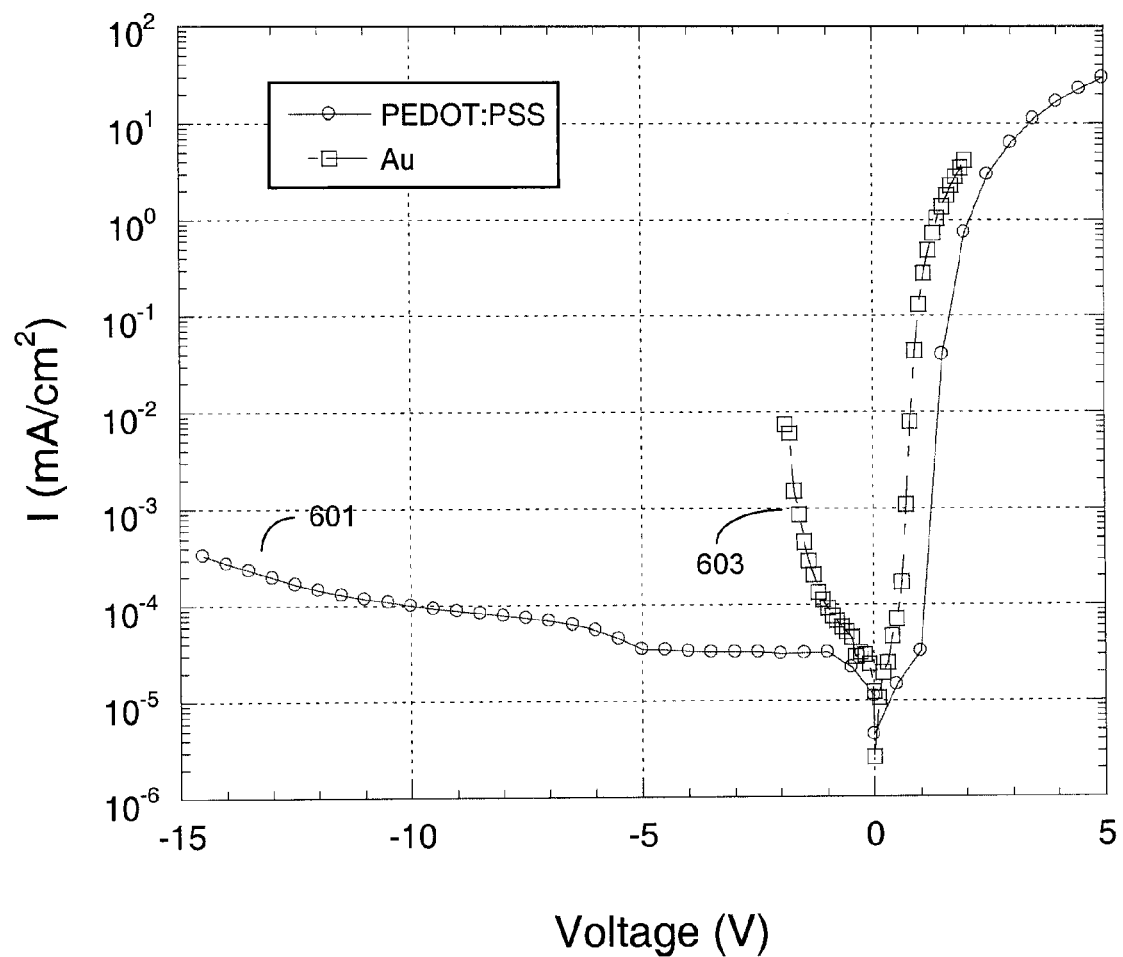
FIG. 6 presents I-V characteristics for Ta/Ta$_2$O$_{5-\delta}$ (30 nm)/PEDOT:PSS device (curve 601) and for a Ta/Ta$_2$O$_{5-\delta}$ (30 nm)/Au device.

Surface traps present a prominent problem in inorganic semiconductors. When a metal layer is connected to a metal-oxide, the I-V characteristic is frequently determined by the trap energy level rather than the work function of the contact metal. This effect is called "Fermi-energy pinning to defect energy" in device field. Surface defects and their influence on I-V characteristics in two-terminal devices were observed in TaO/metal interface. FIG. 6 compares the I-V characteristic of a Ta/TaO(30 nm)/Au(100 nm) device (curve 603) with the IV characteristic of Ta/TaO(30 nm)/PEDOT:PSS (BAYTRON P PH500®) device (curve 601). The fabrication process for the Ta/TaO(30 nm)/PEDOT:PSS device was as described in Example 2. The fabrication process for the Ta/TaO(30 nm)/Au(100 nm) device differs from the process described in the Example 2 only at the point of anode fabrication. For the device with the gold anode, the gold was thermally deposited after TaO was formed by anodization. Gold was deposited in an evaporator under a base pressure of $<2 \times 10^{-6}$ torr.

While the work function of Au is 5.1 eV [D. R. Lide, CRC Handbook of Chemistry and Physics (CRC Press, Boca Raton, 1991)], and is similar to that of PEDOT, substantial differences are observed in I-V characteristics for the Au and PEDOT:PSS devices. The differences between the two devices reveal the existence of traps between Ec of TaO and the work function of the Au (5.1 eV). As demonstrated in Example 5, the onset of the exponential turn-on in forward bias correlates with this energy barrier height. In the device having the gold anode, the exponential current turn on occurs at a few tenth of a volt, which is substantially lower than the voltage of a current turn-on seen in the PEDOT:PSS device. The current in reverse bias is also substantially higher than that observed in PEDOT:PSS device, suggesting a lower energy barrier $\Delta 3$ between Au and TaO. These two evidences revealed that the Fermi-energy of the gold anode layer was pinned to trap states with energy levels of about several hundred meV below Ec of TaO.

The surface traps can be reduced by using a slightly acidic composition to clean the surface of the metal oxide. For example, slightly acidic PEDOT:PSS suspensions can be applied. Independently or in concert with the self cleaning effect, the p++ nature of the anode extracts electrons from the surface traps and dramatically reduces the pinning effect.

This example demonstrated that the surface defects at metal-oxide surface can be removed in situ during PEDOT:PSS printing process. The chemical structure and the electronic structure of PEDOT:PSS, provides both acidic treatment and electron extraction due its p++ nature. Both of these effects played a role of compensator/cleaner for the surface defects at TaO/PEDOT interface.

Example 6

Ti/TiO$_x$/PEDOT:PSS Two-terminal Switching Device

A similar device to the device of Example 2 was fabricated using titanium as the cathode layer. A 300 nm thick titanium film was formed by DC sputtering similarly to the method used in Example 2. Similar anodization process to the one described in Example 2 was used (using same anodization agent, same current and the same rate) to form a layer of TiO$_x$. PEDOT:PSS was deposited on the TiO$_x$ layer using an analogous process to the process described in Example 2. The work function of Ti is about 4.2 eV, and is very closely matched with Ec of TiO$_x$ (about 4.2 eV). Therefore, a good ohmic contact is formed at Ti/TiO$_x$ interface.

Figure 7:
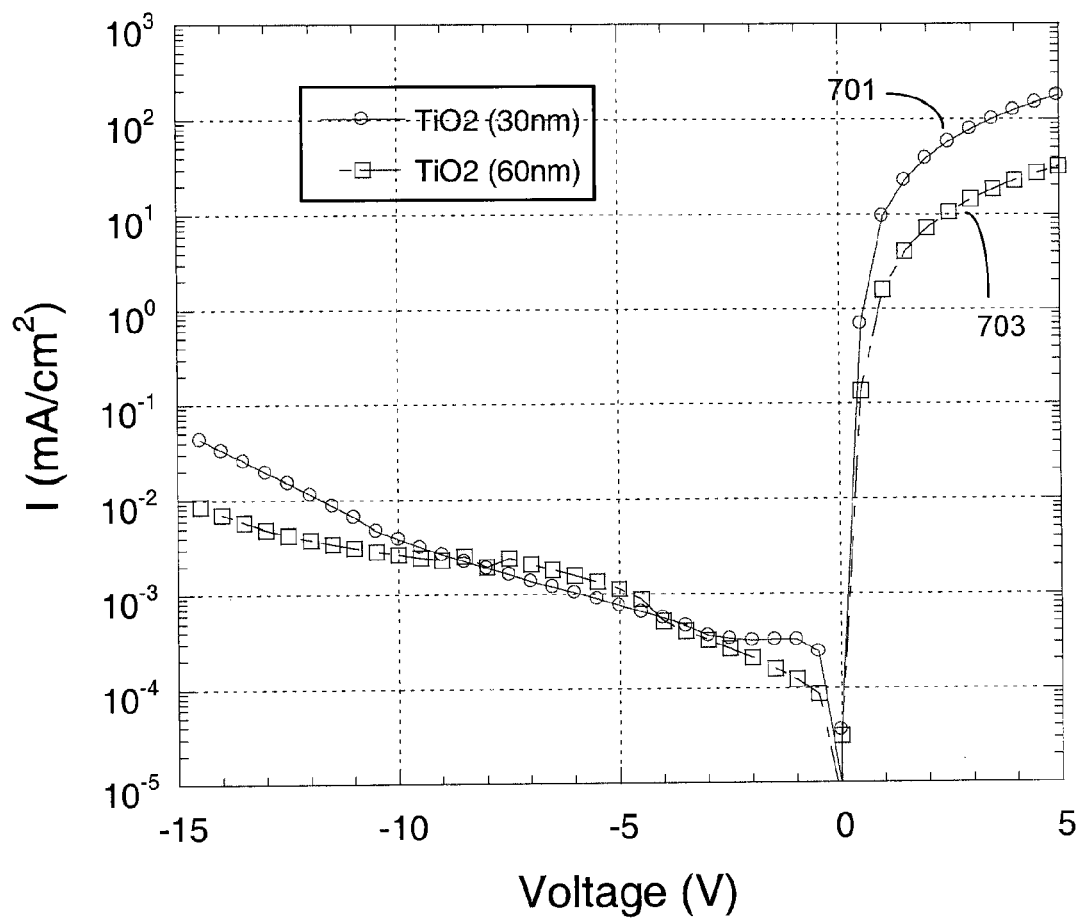
FIG. 7 presents I-V characteristics for a Ti/TiO$_{2-\delta}$ (30 nm)/PEDOT:PSS device (curve 701) and for a Ti/TiO$_{2-\delta}$ (60 nm)/PEDOT:PSS device (curve 703).

FIG. 7 shows the I-V characteristics for two devices having a 30 nm TiO$_x$ layer (curve 701) and 60 nm TiO$_x$ layer (curve 703). In a device having a 30 nm thick TiO$_x$ layer, the exponential current turn-on dominates $10^{-6}$-1 mA/cm$^2$ current density range, over six orders of magnitude. Fitting with Schottky diode model, a perfect factor n~2 was obtained. The current reaches 1 mA/cm$^2$ at 1 V, and 100 mA/cm$^2$ at ~3V. The rectification ratio at 3V was ~$2 \times 10^5$. The switch ratio I(+4V)/I(-15V) was ~$2 \times 10^3$. In the device having 60 nm thick TiO$_x$ layer, the forward voltage corresponding to current of 10 mA/cm$^2$ was ~2.5V. The switch ratio at I(4V)/I(-15V) was at $2 \times 10^3$ level.

This example demonstrated that other n-type semiconductor compounds can be used for the semiconductor layer of the switch.

Example 7

Devices with Printed PANI Anode

Ta/TaO portion of the device was prepared as described in the Example 2. Two different conducting polyaniline inks were then evaluated as anode materials. One ink was a conducting polymer PANI:DBSA in xylene solution. The conductivity of PANI:DBSA in cast film was measured to be about 100 S/cm. Another conductive ink was a water dispersion of PANI:Phosphonate with bulk conductivity of about 5~10 S/cm in printed films. The anode electrodes were formed with an inkjet machine (Microfab Jetlab 4) with a 35 pl nozzle. The printed line width was in the range of about 80-120 μm. The device size was defined by the widths of the cathode and anode lines arranged in orthogonal directions, and was about $3 \times 10^{-4}$ cm$^2$. In this experiment, the TaO thickness was 40 nm, which was achieved by anodization in 0.1 M citric acid at room temperature.

Figure 8:
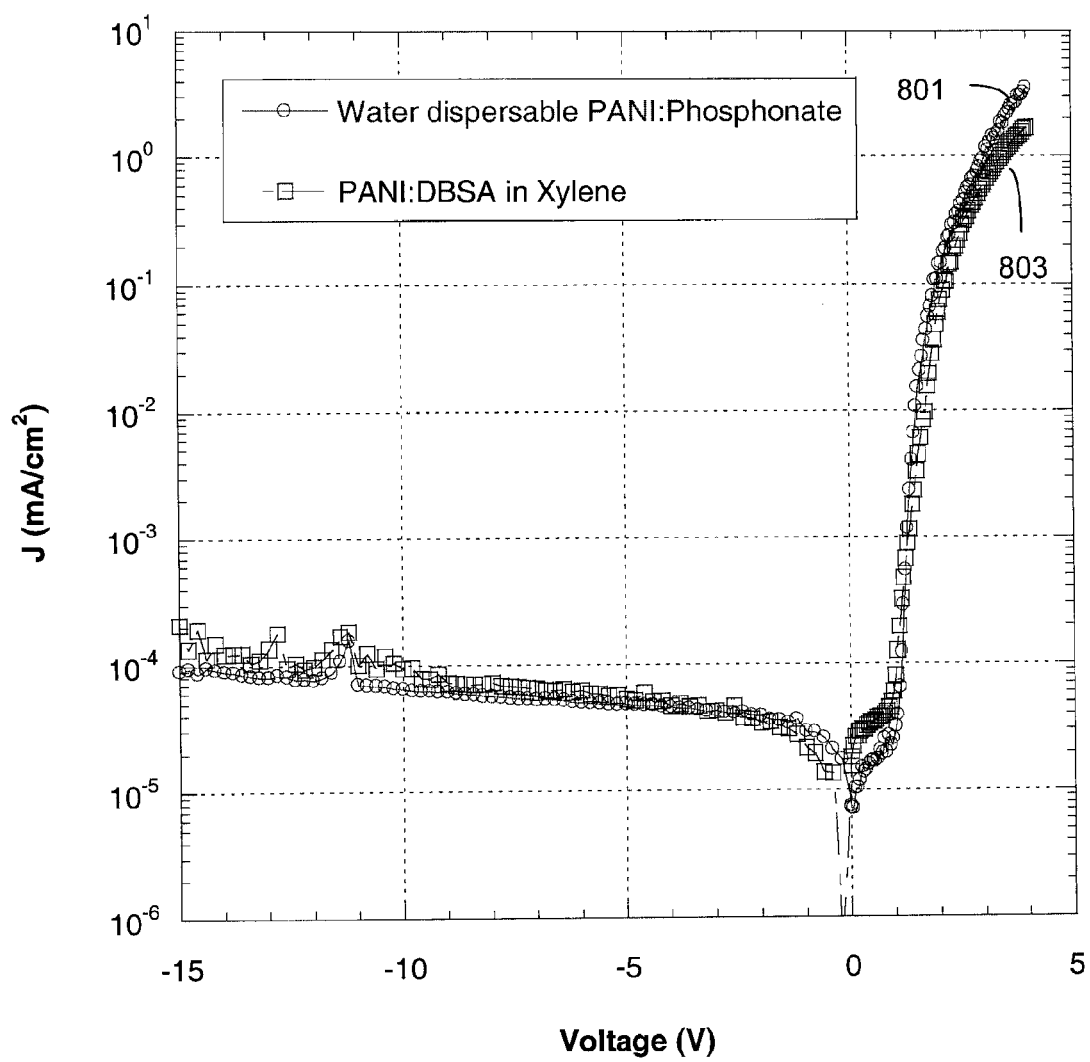
FIG. 8 presents I-V characteristics for Ta/Ta$_2$O$_{5-\delta}$/PANI:Phosphonate device (curve 801) and for a Ta/Ta$_2$O$_{5-\delta}$/PANI:DBSA device (curve 803).

The current switching characteristics are shown in FIG. 8. Curve 801 presents the I-V plot for the device having a PANI:Phosphonate anode. Curve 803 presents the I-V plot for the device having a PANI:DBSA anode. Very similar I-V characteristics were obtained for these devices. The forward current reached 10 mA/cm$^2$ at a voltage of 3-3.5 V. The reverse current saturated at ~$10^{-4}$ mA/cm$^2$ at -15V. For PANI:Phosphonate, the rectification ratio at 4V was ~$8 \times 10^4$. The current switch ratio at I(+4V)/I(-15V) was ~$4 \times 10^4$. The performance was as good as the performance of the device having the PEDOT:PSS anode (see Example 2).

In another experiment, the device size was scaled down to a 10 μm Ta line. The anode was printed with a Dimatix inkjet printer with a 10 pl nozzle. 30-40 μm line width was obtained. The device area was $3-4 \times 10^{-6}$ cm$^2$. I-V characteristics similar to those in FIG. 8 and FIG. 4 was obtained.

In another experiment a Ta/TaO/PPY:PSS device was prepared using an aqueous PPY:PSS suspension (available from Aldrich, CAS No. 577030). Similar performance was also observed.

This example demonstrated that a variety of conducting polymers can be used as the anode in the switch diode.

This example also demonstrated that the diode performance is scaleable in wide device sizes down to $10^{-6}$ cm$^2$, which is sufficiently small for display pixel drivers.

This example also demonstrated that the anode can be processed by inkjet printing in addition to spin-coating, dispensing and other process means known in the printing and coating industry.

Example 8

Two-terminal Switching Device with an Inorganic P-type Anode (Ta/TaO/MoO)

Ta/TaO(30 nm) partially fabricated device was prepared according to the process shown in Example 2. After anodization, the sample was placed in an evaporator and 150 nm thick layer of MoO was deposited thermally onto the TaO top surface. No other surface treatment was performed on TaO. The thermally deposited MoO is a p-type semiconductor with the top of valence band at ~5.3 eV.

Figure 9A:
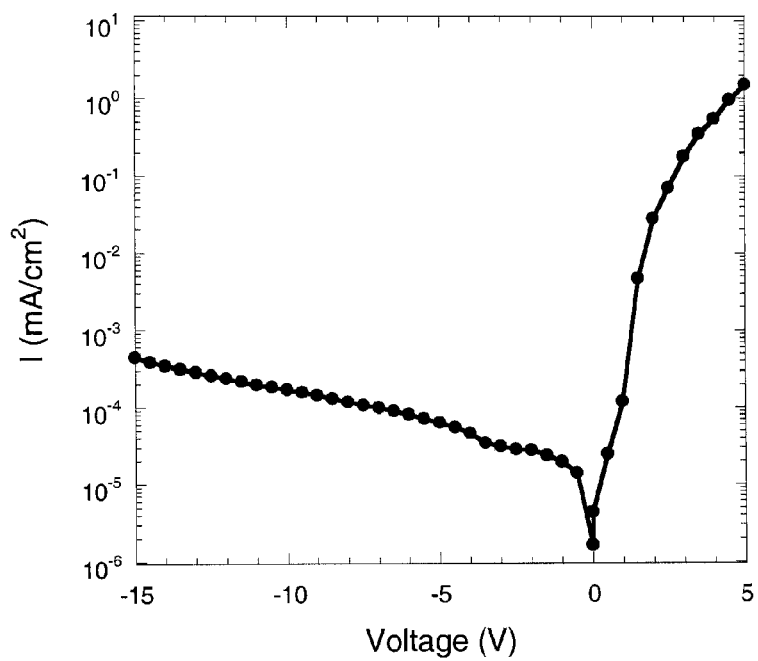
FIG. 9A presents I-V characteristics for Ta/Ta$_2$O$_{5-\delta}$/MoO$_x$ device, where the anode was thermally deposited.

FIG. 9(a) shows the I-V characteristic of this device. Forward bias is defined as the higher potential applied to MoO electrode. In this test, no other contact layer was placed on top of the MoO. The test probe was placed approximately 1 mm away from the diode area. The rectification ratio at 4V was $2 \times 10^4$ and the current switch ratio $I(4V)/I(-15V)$ was ~$1.3 \times 10^3$.

Figure 9B:
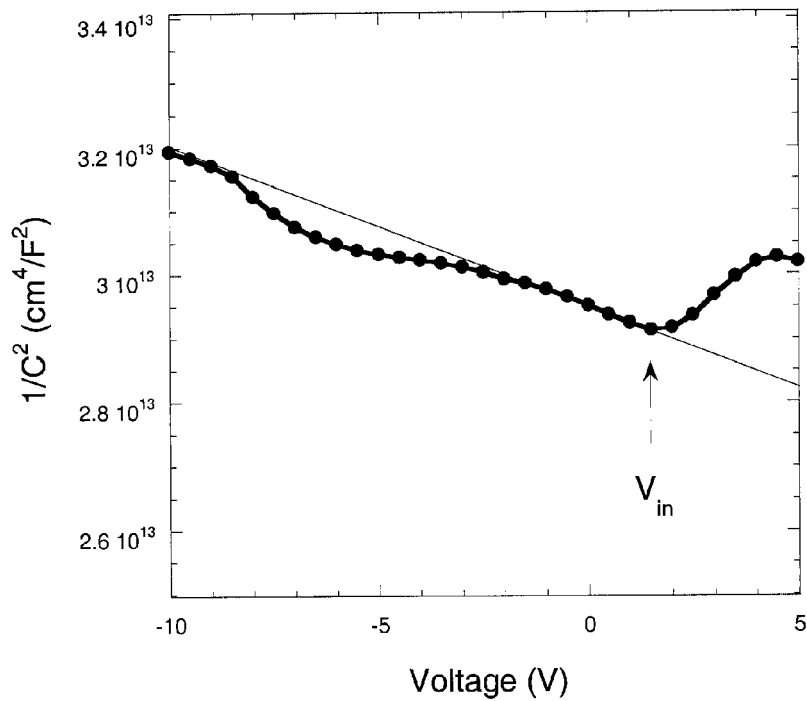
FIG. 9B presents a 1/C$^2$ vs. voltage plot for Ta/Ta$_2$O$_{5-\delta}$ (30 nm)/MoO$_x$ device.

FIG. 9B presents a $1/C^2$-V plot for this device. The onset of the exponential current turn-on in I-V is consistent with the $V_{in}$ determined from the $1/C^2$-V plot (FIG. 9B). Both plots measure the build-in potential in this device. Considering that Ec of TaO is 3.9 eV and Ev of MoO is ~5.3 eV, their difference is in accord with the Vin observed in both I-V and C-V.

This example demonstrated that a switching device having an inorganic p-type anode characterized by high switching ratio can be prepared.

Example 9

Two-terminal Switching Device with a Printed Inorganic P-type Anode (Ta/TaO/MoO)

Figure 10:
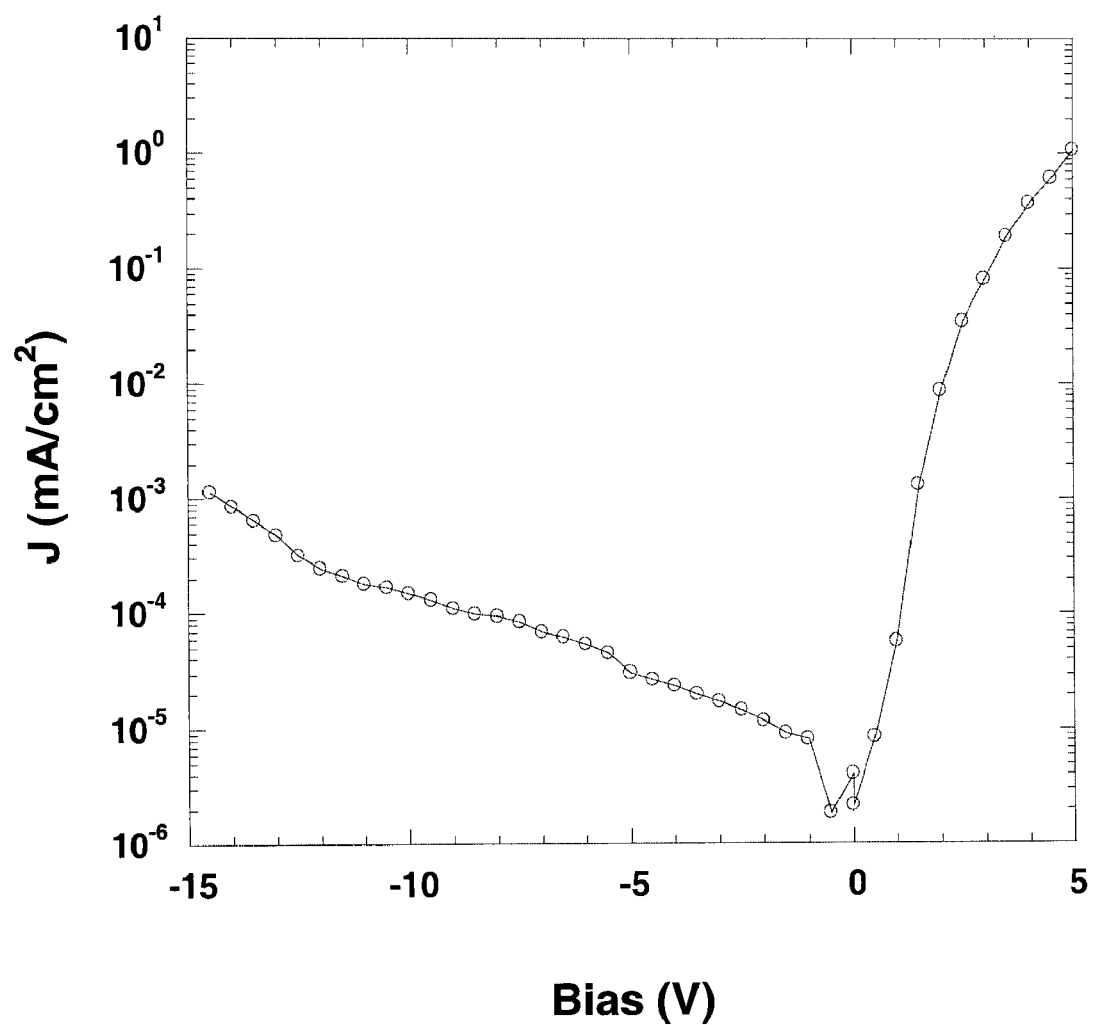
FIG. 10 presents I-V characteristics for Ta/Ta$_2$O$_{5-\delta}$/MoO$_x$ device, where the anode was deposited using a liquid-phase method.

Example 8 was repeated with the top MoO anode being deposited from a soluble organometallic precursor. Molibdenum (V) isopropoxide ($Mo(OC(CH_3)_2)_5$ (available from Alfa Aesar, Ward Hill, Mass.) was used as a precursor in the form of a solution (5% wt.). The anode film was deposited using a solution dispenser applying the solution to the targeted dimension. After the precursor was applied, the substrate was kept at 200° C. for 10 minutes to form the MoO. The resulting MoO was less conductive than the MoO formed by thermal deposition in Example 8. A gold top electrode was thus used to connect the top of MoO to the probing area. The I-V characteristics for this device are shown in FIG. 10. The profile was quite similar to that shown in FIG. 9(a). The rectification ratio at 5V was ~$5 \times 10^4$. The current switch ratio $I(4V)/I(-15V)$ was ~$10^3$.

The results in Examples 8 and 9 demonstrated that the anode can be fabricated with a p-doped inorganic semiconductor layer.

They also demonstrated that the anode can be formed with thermal deposition, or with a solution process along with a low temperature baking.

Example 10

Stability of Two-terminal Switching Devices Having a PEDOT:PSS Anode

Figure 11:
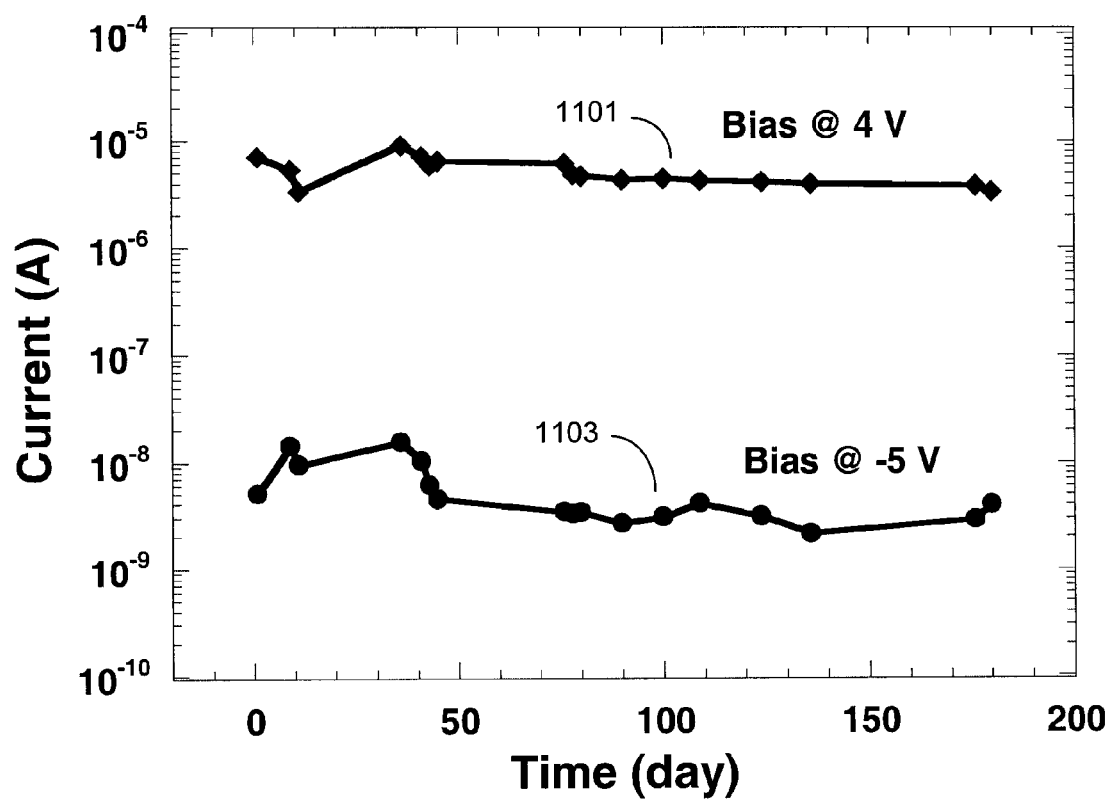
FIG. 11 illustrates stability of Ta/Ta$_2$O$_{5-\delta}$/PEDOT:PSS devices. The stability of current in a forward bias is illustrated by curve 1101. The stability of current in a reverse bias is illustrated by curve 1103.

Measurements of shelf-stability of two-terminal switching devices were conducted. FIG. 11 shows shelf-stability plot for a device with a structure of Ta/Ta$_2$O$_{5-\delta}$/PEDOT:PSS in a non-encapsulated form. Current at a forward bias of 4V is shown by curve 1101. Current at a reverse bias of −5 V is shown by curve 1103. It is shown clearly that both forward and reverse currents only drop 10% after 180 days. However, the switch ratio ($I(4V)/I(-5V)$) remains without noticeable change after testing for 4320 hours.

This experiment demonstrated that certain devices described herein are stable in un-encapsulated form. Such devices are desired for applications that make use of plastic substrates in which the chemical barriers to water and oxygen are limited. Integration of such devices into an active matrix display will provide sufficient protection for practical applications due to additional packaging protection provided during integration. Devices with such long lifetimes are especially suitable for applications with plastic substrates for which the water-vapor transfer rate is typically in 10-0.1 g/m$^2$/day range, substantially lower than that of glass or a pinhole-free metal foil.

Example 12

Two-terminal Switching Devices Configured to Drive a Display

Ta/Ta$_2$O$_{5-\delta}$/PEDOT devices were used to construct pixel drivers for a display. The display comprised 24 columns and 24 rows. The pitch size of each display element was 2 mm×2 mm (12.5 dot-per-inch format). Electrophoretic display (EPD) film purchased from Sipix Image Inc., Fremont, Calif. was used for display elements. The reflectivity of such EPD films can be changed by application of a certain level of external voltage to its front and back electrode. The reflectivity, when changed, can hold after the external bias is withdrawn. By applying a forward 15 V bias for 0.5-1.5 seconds, the EPD film turns to white color with a reflection of ~30%. Under bias of −15 V applied for ~1-4 seconds, the EPD films turns to deep green color with light reflection of less than 3%. At voltage bias of less than 2 V bias, the EPD film retains the color previous recorded. Asymmetric switching devices described herein were used to drive the EPD front plane. The circuit for driving each EPD pixel comprised a selection line, a data line, a switch diode and a resistor in serial to form a voltage divider. The pixel electrode and the corresponding driving scheme were disclosed in U.S. application Ser. No. 11/430,075 by H. -C. Lee et al. previously incorporated by reference. The EPD pixel was connected to the anode of the switch diode and to one side of the resistor. The switch device structural parameters, process conditions and performance parameters were similar to those disclosed in the Example 2. The thicknesses of Ta and Ta$_2$O$_{5-\delta}$ were 300 nm and 30 nm respectively. The anode was printed with a solution dispenser (Asymtek 402), and the ink was PEDOT:PSS purchased from Bayer, product code 4083 and was re-formulated to proper viscosity for the printing tool. After the active-matrix backplane (the plane comprising a matrix of the pixel drivers in the same format of 24×24 matrix) was made with the top most layer in the form of 24×24 pixel electrode to contact the EPD front panel, the EPD film was laminated with the free-surface side in contact with the pixel electrodes on the backplane, and with proper pressure (~2 lb/cm$^2$) at 80-100° C. Such diode based Active matrix EPD display can be operated at a voltage range of 10-18 V. Commercial CMOS drivers can be used as peripheral row drivers and column drivers outside the display area.

Figure 12:
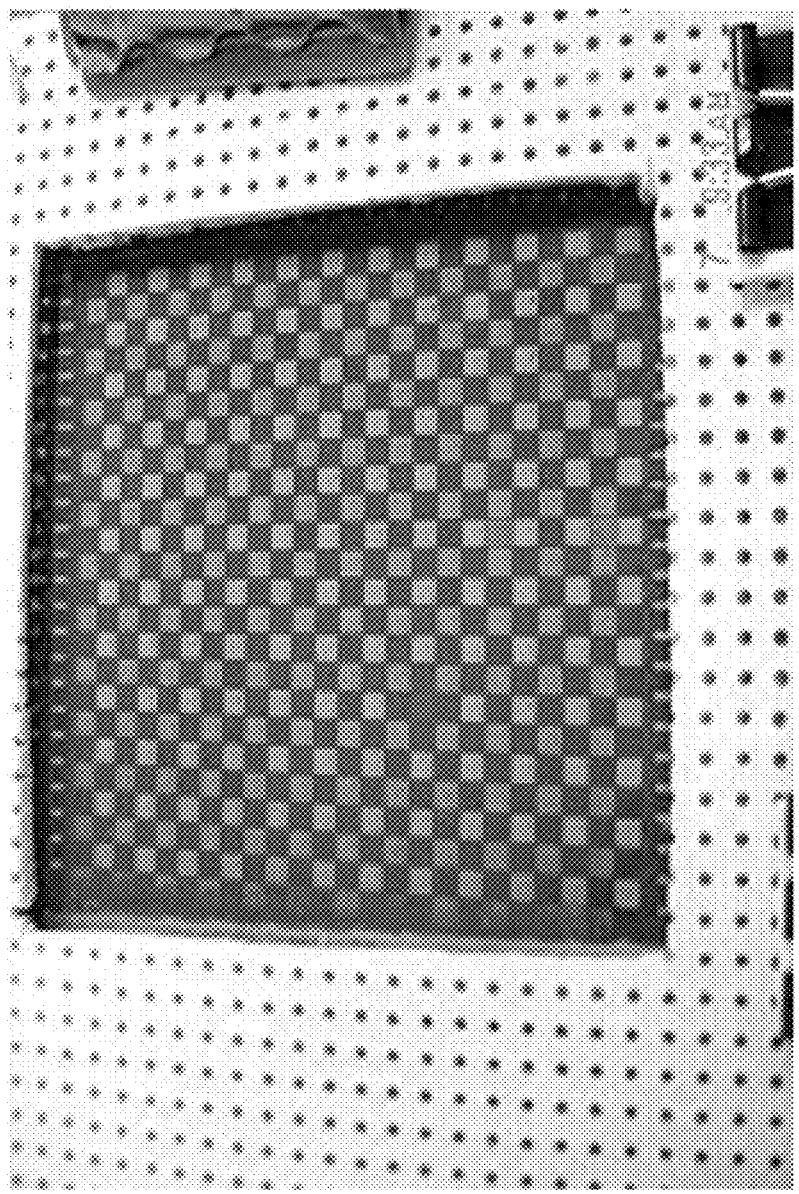
FIG. 12 is a checkerboard pattern obtained with an active matrix electrophoretic display (AM-EPD) display fabricated according to certain embodiments of present invention.

An image of a checkerboard pattern obtained on a AMEPD display using the switching devices described herein is presented in FIG. 12.

In another example, active matrix EPD displays were fabricated in a 128×160 dot matrix form. The pitch size was 250 µm×250 µm. The display employed a driver design and a corresponding driving scheme disclosed in U.S. patent application Ser. No. 11/650,148, previously incorporated by reference. The size of the switch diode at each pixel was 10 µm×40 µm, defined by 10 mm wide Ta line and a dot of PEDOT:PSS anode of ~40 µm diameter. Testing result confirmed that this display can be addressed at 0.5-8 mS per row. A frame of image can be written within the EPD response time (0.3-1.5 second). The 0.5-8 mS per row writing time allows the TFD array be made with pixel counts over $10^4$-$10^6$, and be used for high information content applications (typically comprises 128-1024 rows).

This example demonstrated that the described two-terminal switches can be used to construct pixel drivers for displays.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An electronic device comprising:
   a substrate;
   a plurality of two-terminal switching devices disposed on the substrate, wherein each two-terminal switching device comprises:
      a first electrode comprising a layer of first conductive material, having a first work function;
      a layer of a broad band semiconducting material physically separate from the layers of semiconducting material on other of the two-terminal switching devices, wherein the band gap of the broad band semiconductor is at least about 2.5 eV and the carrier concentration in the broad band semiconductor is less than about $10^{18}$ cm$^{-3}$; and
      a second electrode comprising a layer of a second conductive material, having a second work function, wherein the second conductive material comprises a material having a p+ or p++ type conductivity; wherein
      at least a portion of the semiconductor layer resides between the first and second conductive materials, wherein the second work function magnitude is greater than the first work function magnitude.

2. The electronic device of claim 1, wherein the energy difference between a Fermi level of the first conductive material and the lowest energy level of a conduction band of the broad band semiconducting material is not greater than about 0.3 eV.

3. The electronic device of claim 1, wherein the carrier concentration in the second conducting material is at least about $10^{18}$ cm$^{-3}$.

4. The electronic device of claim 1, wherein the work function magnitude of the second conductive material is at least about 0.6 eV greater than the work function magnitude of the first conductive material.

5. The electronic device of claim 1, wherein the energy barrier between the lowest energy level of the conduction band of the p+ or p++ conducting material and the lowest energy level of the conduction band of the broad-band semiconductor material is about 0.3 eV or less.

6. The electronic device of claim 1, wherein the substrate is flexible.

7. The electronic device of claim 1, wherein at least some of the two-terminal switching devices of the array are electrically connected to one another by conductive lines.

8. The electronic device of claim 1, wherein the electronic device is a backplane for a display.

9. The electronic device of claim 8, wherein the two-terminal switching devices are configured to regulate light from a pixel of the display, wherein the display comprises a plurality of pixel control circuits, and wherein each pixel control circuit of the plurality comprises at least one of said two-terminal switching devices.

10. The electronic device of claim 9, wherein the switching device is configured to regulate light from a pixel of an electrophoretic or a rotating element display.

11. The electronic device of claim 9, wherein the switching device is configured to regulate light from a pixel of a liquid crystal display.

12. The electronic device of claim 1, wherein the broad band semiconducting material is a 2-6 valence compound.

13. The electronic device of claim 1, wherein the first conductive material comprises a metal selected from the group consisting of Mg, Ca, Sr, Ba, Ti, Ta, Al, In, Nb, Hf, Zn, Zr, Cu, Sn, V, Cr, Mn, Ga, Mo, Ni and Y and wherein the broad band semiconducting material comprises a metal oxide or an inorganic ceramic nanocomposite selected from the group consisting of $Mg_xO_y$, $Ca_xO_y$, $Sr_xO_y$, $Ba_xO_y$, $Ti_xO_y$, $Ta_xO_y$, $Al_xO_y$, $In_xO_y$, $Nb_xO_y$, $Hf_xO_y$, $Sn_xO_y$, $Zn_xO_y$, $Zr_xO_y$, $Cu_xO_y$, $Y_xO_y$, $Y_xBa_yO_z$, and $Sm_xSn_yO_z$.

14. The electronic device of claim 1, wherein the first conductive material comprises a metal selected from the group consisting of Mg, Ca, Sr, Ba, Ti, Ta, Al, In, Nb, Hf, Zn, Zr, Cu, Sn, V, Cr, Mn, Ga, Mo, Ni and Y and wherein the broad band semiconducting material comprises a metal chalcogenide.

15. The electronic device of claim 1, wherein the first conductive material comprises a metal selected from the group consisting of Mg, Ca, Sr, Ba, Ti, Ta, Al, In, Nb, Hf, Zn, Zr, Cu, Sn, V, Cr, Mn, Ga, Mo, Ni and Y; wherein the broad band semiconducting material comprises a metal oxide, an inorganic ceramic nanocomposite, or a metal chalcogenide, and wherein the second conductive material comprises one or more conductive polymers selected from the group consisting of polythiophenes, polypyrroles, polyanilines, polythienothiophenes, and copolymers thereof, wherein each of the conductive polymers is substituted or unsubstituted.

16. The electronic device of claim 1, wherein the layers of two-terminal switching devices are formed as stacks on the substrate, with the first electrodes located proximate the substrate within the stacks and the second electrodes located distal with respect to the substrate in of the stacks.

17. The electronic device of claim 1, wherein the electronic device comprises a column-row addressable electric switch matrix.

18. The electronic device of claim 1, wherein for the two-terminal switching devices $I_{on}(V_{on})/I_{off}(V_{off})$ is at least about 1,000, wherein the forward bias ($V_{on}$) is about 2 V, and the reverse bias ($V_{off}$) is about −15 V.

19. The electronic device of claim 1, wherein each two-terminal switching device further comprises a layer of an organic semiconductor between a layer of an inorganic broad-band semiconductor, and the layer of the second conductive material.

20. The electronic device of claim 1, wherein the electronic device is selected from the group consisting of a Microelectromechanical System (MEMS) device, a field emission device, an electrochromic device, an electroluminescent device, a photodetector, and a biosensor.

21. The electronic device of claim 1, wherein the electronic device is an electroluminescent device.

22. The electronic device of claim 1, wherein the electronic device is a photodetector.

23. The electronic device of claim 1, wherein the electronic device is a biosensor.

24. A method of forming a two-dimensional switching device comprising:
  (a) forming a first electrode of the two-terminal switching device on a substrate, wherein the first electrode comprises a layer of a first conductive material, the first conductive material being characterized by a first work functionmagnitude;
  (b) forming a layer of broad band semicinductor over at least a portion of the first electrode, wherein the band gap of the broad band semiconductor is at least about 205 eV and the carrier concentration in the broad band semiconductor is less thatn about $10^{13}$ cm$^{-3}$; and
  (c) forming a second electrode by forming a layer of a second conductive material having a second work function value, wherein the second conductive material comprises a material having a p+ or p++ type conductivity, wherein the second wirk function magnitude is greater than the first work functin magnitude.

* * * * *